(12) United States Patent
Liao et al.

(10) Patent No.: US 10,658,287 B2
(45) Date of Patent: May 19, 2020

(54) SEMICONDUCTOR DEVICE HAVING A TAPERED PROTRUDING PILLAR PORTION

(71) Applicant: Taiwan Semiconductor Manufacturing Co., Ltd., Hsinchu (TW)

(72) Inventors: Sih-Hao Liao, New Taipei (TW);
Hung-Jui Kuo, Hsinchu (TW);
Yu-Hsiang Hu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/992,200

(22) Filed: May 30, 2018

(65) Prior Publication Data
US 2019/0371726 A1    Dec. 5, 2019

(51) Int. Cl.
| H01L 23/52 | (2006.01) |
| H01L 23/31 | (2006.01) |
| H01L 23/538 | (2006.01) |
| H01L 23/522 | (2006.01) |
| H01L 21/768 | (2006.01) |
| H01L 21/822 | (2006.01) |
| H01L 23/00 | (2006.01) |

(52) U.S. Cl.
CPC ...... *H01L 23/5226* (2013.01); *H01L 21/7684* (2013.01); *H01L 21/76885* (2013.01); *H01L 21/8221* (2013.01); *H01L 23/3121* (2013.01); *H01L 23/5384* (2013.01); *H01L 24/09* (2013.01); *H01L 2224/0231* (2013.01); *H01L 2224/02331* (2013.01); *H01L 2224/02379* (2013.01)

(58) Field of Classification Search
CPC ............ H01L 23/5226; H01L 23/3121; H01L 23/5384; H01L 24/09
See application file for complete search history.

(56) References Cited

U.S. PATENT DOCUMENTS

| 8,466,059 B2 * | 6/2013 | Chang ................. | H01L 21/6835 257/E21.577 |
| 8,513,119 B2 * | 8/2013 | Chang ................. | H01L 21/6835 438/667 |
| 8,841,773 B2 * | 9/2014 | Chang ................. | H01L 21/6835 257/758 |
| 8,916,979 B2 * | 12/2014 | Tsai ..................... | H01L 23/481 257/774 |
| 9,000,584 B2 | 4/2015 | Lin et al. | |
| 9,048,222 B2 | 6/2015 | Hung et al. | |
| 9,048,233 B2 | 6/2015 | Wu et al. | |

(Continued)

*Primary Examiner* — Ida M Soward
(74) *Attorney, Agent, or Firm* — JCIPRNET

(57) ABSTRACT

A semiconductor device including a semiconductor die, an encapsulant and a redistribution structure is provided. The encapsulant laterally encapsulates the semiconductor die. The redistribution structure is disposed on the semiconductor die and the encapsulant and is electrically connected to the semiconductor die. The redistribution structure includes a dielectric layer, a conductive via in the dielectric layer and a redistribution wiring covering the conductive via and a portion of the dielectric layer. The conductive via includes a pillar portion embedded in the dielectric layer and a protruding portion protruding from the pillar portion, wherein the protruding portion has a tapered sidewall.

16 Claims, 25 Drawing Sheets

(56) References Cited

U.S. PATENT DOCUMENTS

| | | | |
|---|---|---|---|
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,312,225 B2* | 4/2016 | Chang | H01L 21/6835 |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,620,482 B1* | 4/2017 | Chen | H01L 25/0657 |
| 9,786,618 B2* | 10/2017 | Huang | H01L 24/20 |
| 9,812,337 B2* | 11/2017 | Chen | H01L 25/105 |
| 9,812,426 B1* | 11/2017 | Wang | H01L 24/02 |
| 10,062,648 B2* | 8/2018 | Hsieh | H01L 23/5389 |
| 10,074,623 B2* | 9/2018 | Lee | H01L 21/6835 |
| 10,103,132 B2* | 10/2018 | Lin | H01L 24/97 |
| 10,109,573 B2* | 10/2018 | Lin | H01L 23/49838 |
| 10,157,274 B2* | 12/2018 | Huang | H01L 21/4853 |
| 10,177,115 B2* | 1/2019 | Yu | H01L 21/6835 |
| 10,297,544 B2* | 5/2019 | Wu | H01L 21/76802 |
| 10,332,856 B2* | 6/2019 | Chen | H01L 24/73 |
| 2016/0133562 A1* | 5/2016 | Lee | H01L 24/19 257/774 |
| 2018/0138126 A1* | 5/2018 | Chen | H01L 23/49822 |
| 2018/0158777 A1* | 6/2018 | Chen | H01L 23/5283 |
| 2019/0103391 A1* | 4/2019 | Lai | H01L 21/481 |
| 2019/0139924 A1* | 5/2019 | Chen | H01L 25/115 |
| 2019/0139952 A1* | 5/2019 | Chang | H01L 21/561 |
| 2019/0148267 A1* | 5/2019 | Chen | H01L 23/485 257/737 |
| 2019/0148301 A1* | 5/2019 | Huang | H01L 23/5384 257/774 |

* cited by examiner

US 10,658,287 B2

SEMICONDUCTOR DEVICE HAVING A TAPERED PROTRUDING PILLAR PORTION

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the reliability of the redistribution circuit structure fabricated on the semiconductor die is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
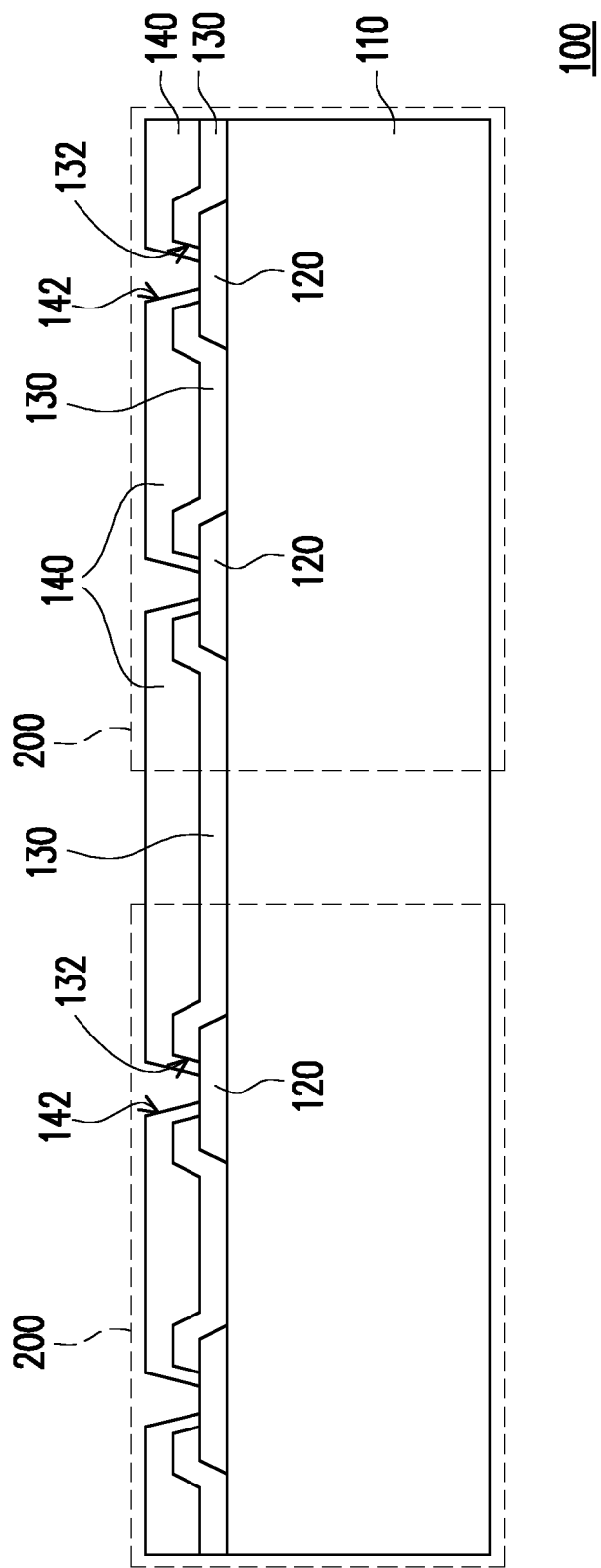
FIGS. 1 through 5 are cross-sectional views of various processing steps during fabrication of a semiconductor die in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 5 are cross-sectional views of various processing steps during fabrication of a semiconductor die 200 in accordance with some embodiments of the present disclosure.

Referring to FIG. 1, a wafer 100 including a plurality of integrated circuit components or semiconductor dies 200 arranged in an array is provided. Before a wafer dicing process is performed on the wafer 100, the semiconductor dies 200 of the wafer 100 are connected one another. In some embodiments, the wafer 100 includes a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may optionally include a post-passivation layer 140 formed over the passivation layer 130. The post-passivation layer 140 covers the passivation layer 130 and has a plurality of contact openings 142. The conductive pads 120 exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, a benzocyclobutene (BCB) or a dielectric layer formed by other suitable polymers.

Figure 2:
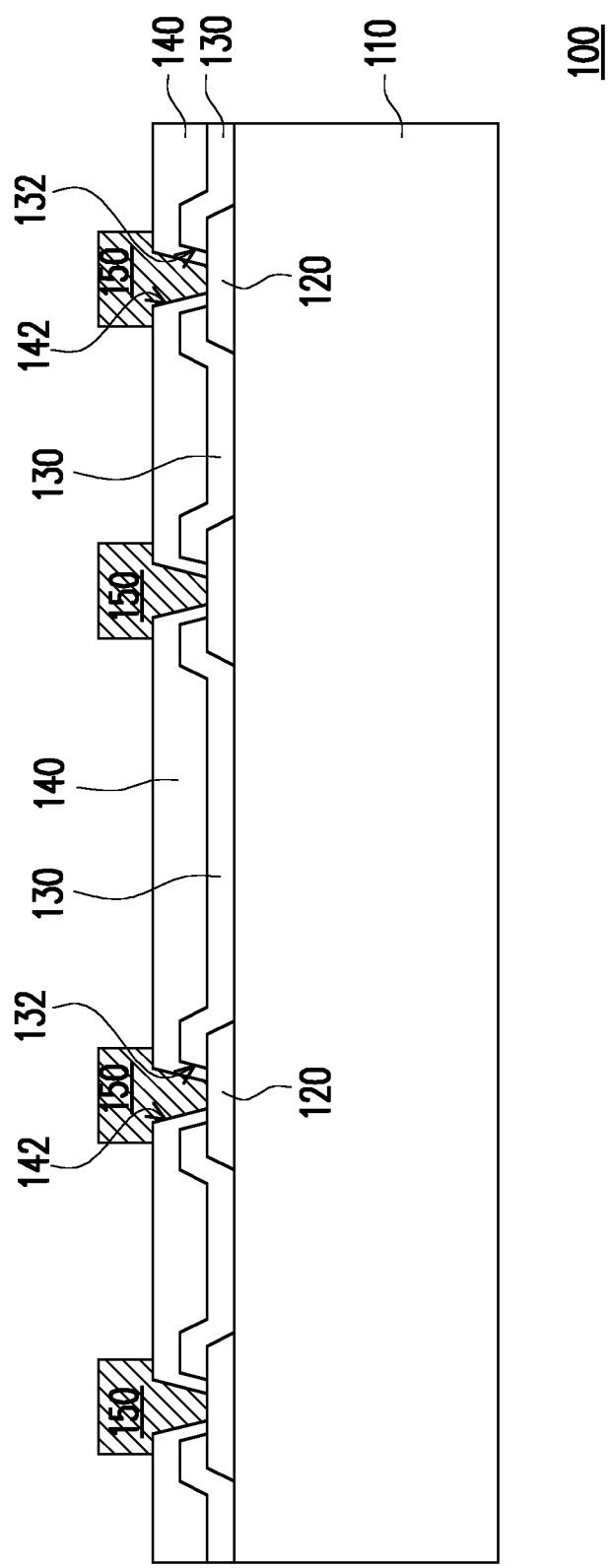

Referring to FIG. 2, a plurality of conductive pillars 150 are formed on the conductive pads 120. In some embodiments, the conductive pillars 150 are plated on the conductive pads 120. The plating process of conductive pillars 150 is described in detail as followings. First, a seed layer is sputtered onto the post-passivation layer 140 and the conductive pads 120 exposed by the contact openings 142. A patterned photoresist layer (not shown) is then formed over the seed layer by photolithography, wherein the patterned photoresist layer exposes portions of the seed layer that are corresponding to the conductive pads 120. The wafer 100 including the patterned photoresist layer formed thereon is then immersed into a plating solution of a plating bath such that the conductive pillars 150 are plated on the portions of the seed layer that are corresponding to the conductive pads 120. After the plated conductive pillars 150 are formed, the patterned photoresist layer is stripped. Thereafter, by using the conductive pillars 150 as a hard mask, portions of the seed layer that are not covered by the conductive pillars 150 are removed through etching until the post passivation layer 140 is exposed, for example. In some embodiments, the conductive pillars 150 are plated copper pillars.

Figure 3:
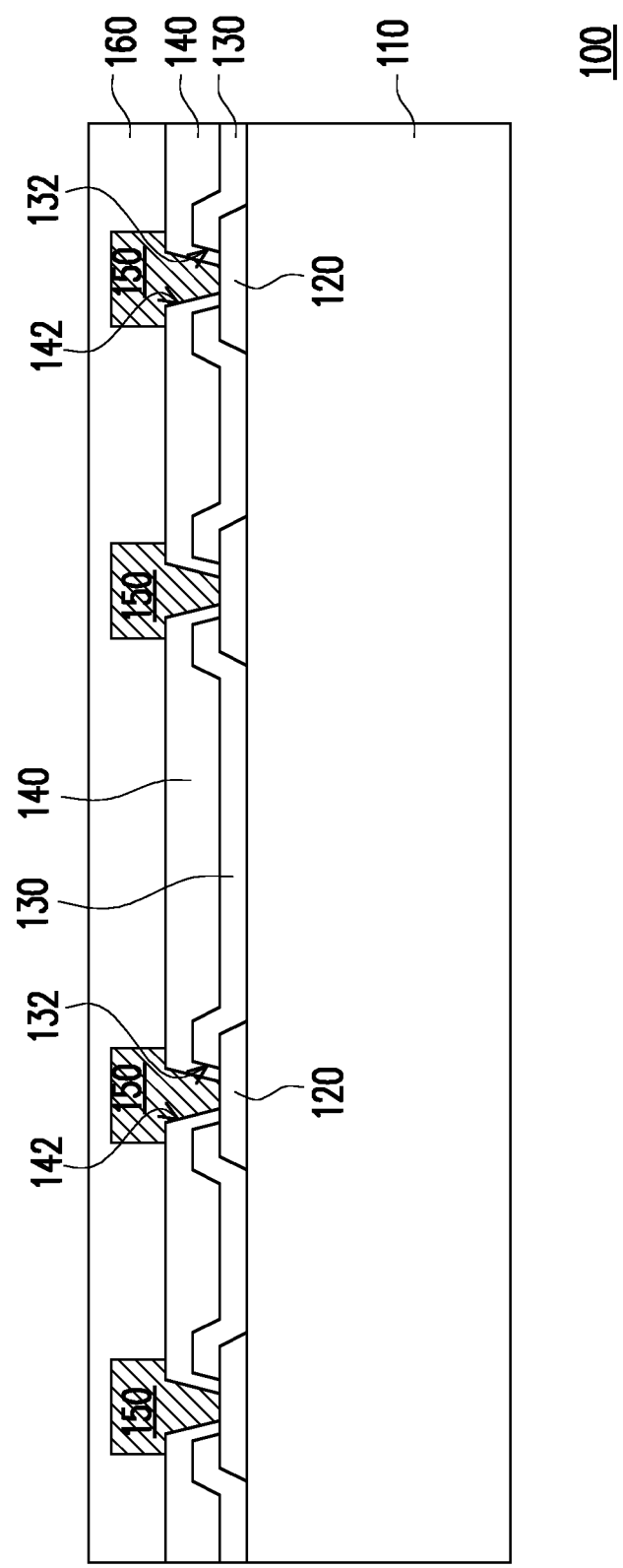

Referring to FIG. 3, after the conductive pillars 150 are formed, a protection layer 160 is formed on the post passivation layer 140 so as to cover the conductive pillars 150. In some embodiments, the protection layer 160 may be a polymer layer having sufficient thickness to encapsulate and protect the conductive pillars 150. For example, the protection layer 160 may be a polybenzoxazole (PBO) layer, a polyimide (PI) layer, a benzocyclobutene (BCB) or other suitable polymers. In some alternative embodiments, the protection layer 160 may be made of inorganic materials.

Figure 4:
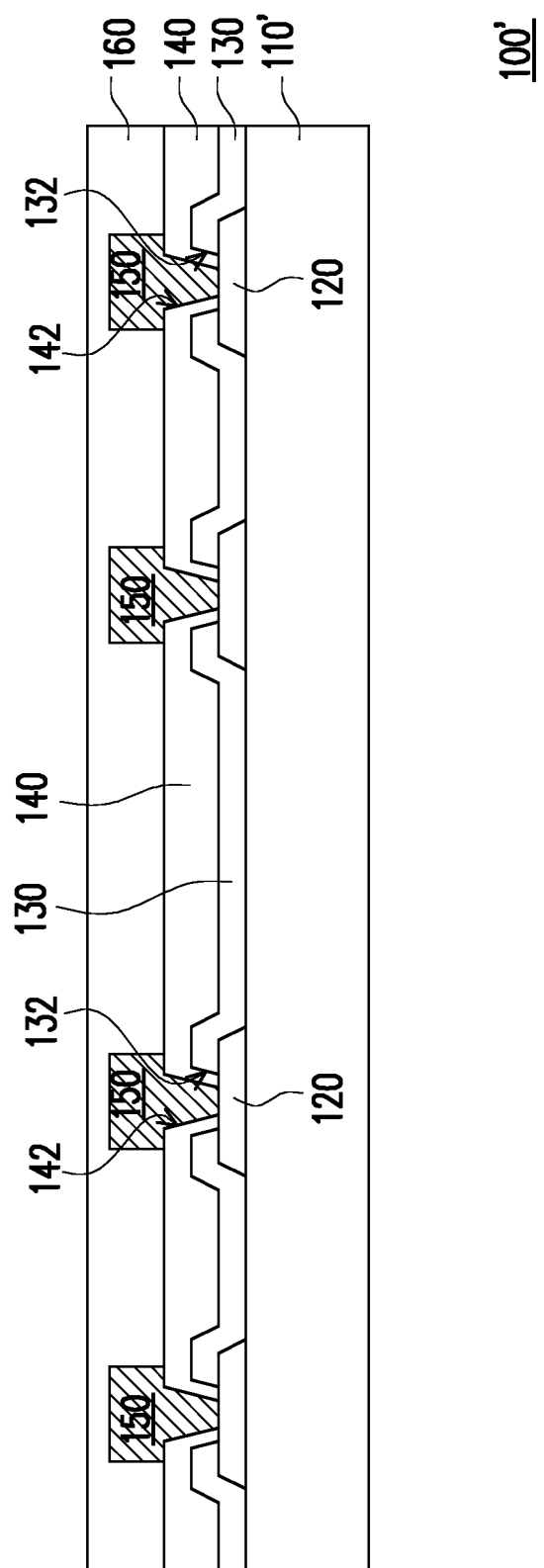

Referring to FIG. 4, a back side grinding process is performed on the rear surface of the wafer 100 after the protection layer 160 is formed. During the back side grinding process, the semiconductor substrate 110 is ground such that a thinned wafer 100' including a thinned semiconductor substrate 110' is formed.

Figure 5:
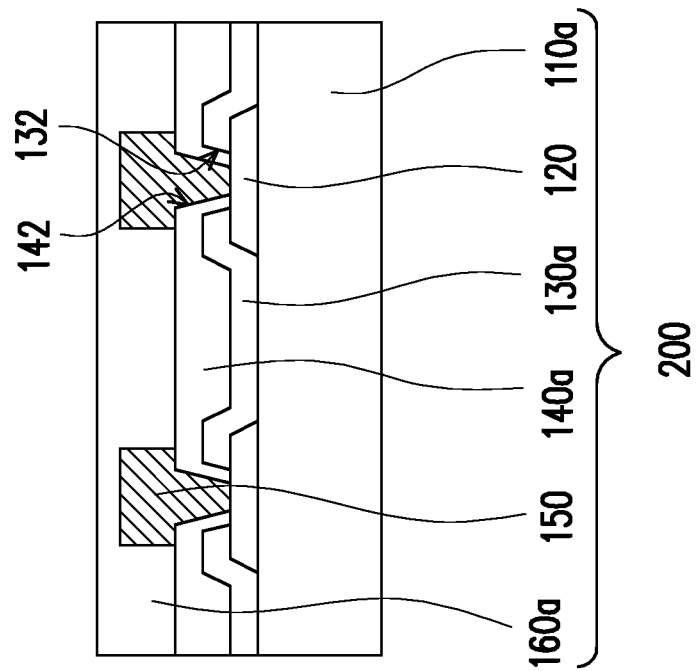
Figure 5:
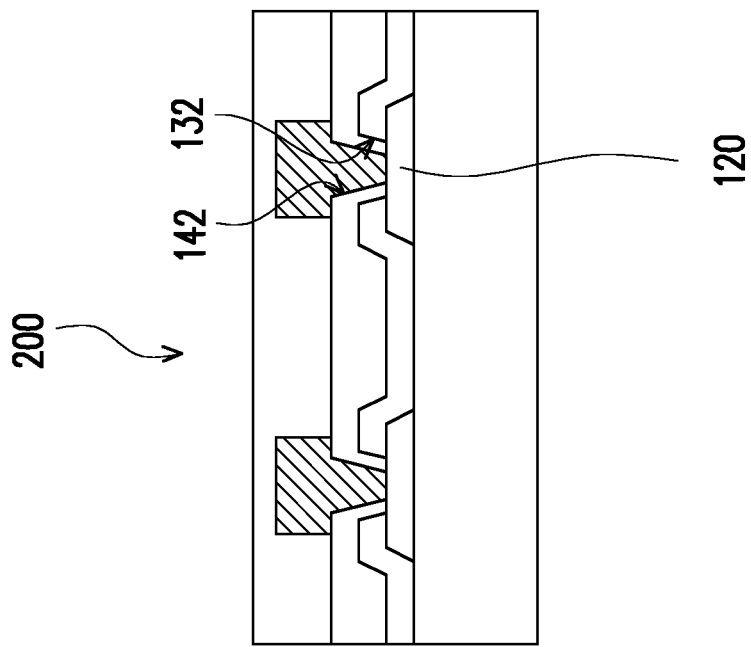

Referring to FIG. 5, after performing the back side grinding process, a wafer dicing process is performed on the thinned wafer 100' such that the semiconductor dies 200 in the wafer 100' are singulated from one another. Each of the singulated semiconductor dies 200 includes a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the materials and the characteristics of the semiconductor substrate 110a, the passivation layer 130a, the post passivation layer 140a, and the protection layer 160a in FIG. 5 are the same as those of the semiconductor substrate 100, the passivation layer 130, the post passivation layer 140, and the protection layer 160 in FIG. 4. Thus, the detailed descriptions of the semiconductor substrate 110a, the passivation layer 130a, the post passivation layer 140a, and the protection layer 160a are omitted.

As shown in FIG. 4 and FIG. 5, during the back side grinding and the wafer dicing processes, the protection layer 160 and 160a may well protect the conductive pillars 150 of the semiconductor dies 200. In addition, the conductive pillars 150 of the semiconductor dies 200 may be protected from being damaged by sequentially performed processes, such as pick-up and placing process of the semiconductor dies 200, molding process, and so on.

FIGS. 6 through 14 and FIGS. 23 through 28 are cross-sectional views of various processing steps during fabrication of a semiconductor package 1000 in accordance with some embodiments of the present disclosure.

Figure 6:
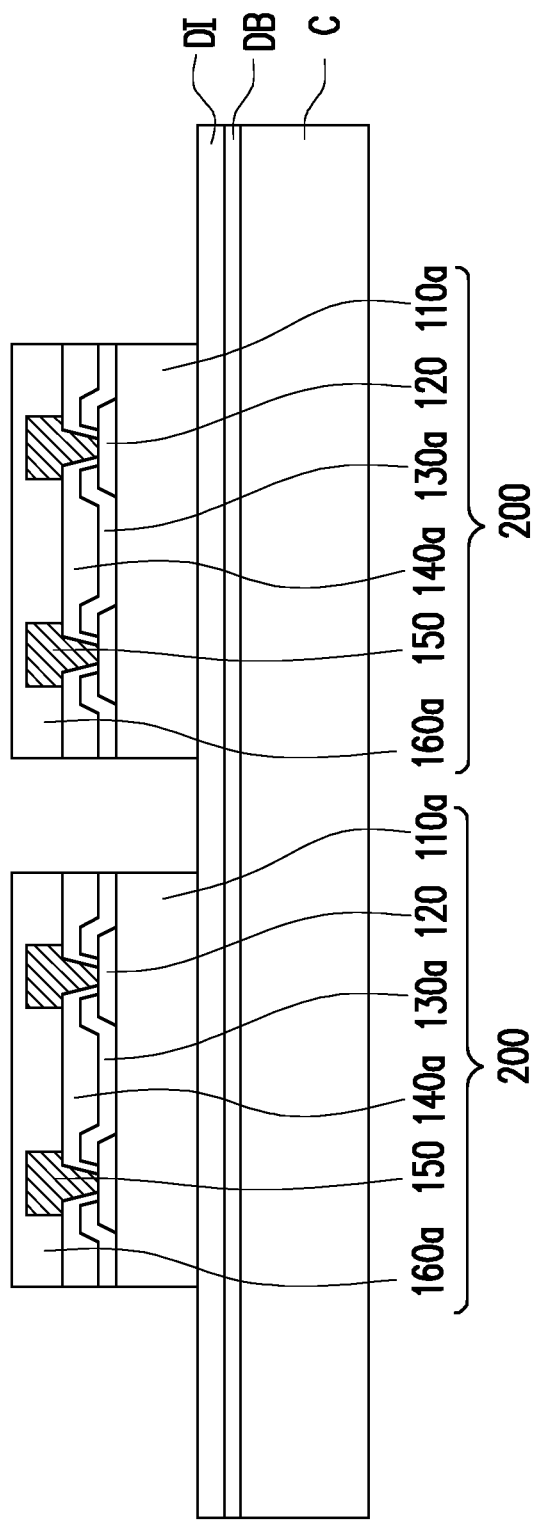
FIGS. 6 through 14 and FIGS. 23 through 28 are cross-sectional views of various processing steps during fabrication of a semiconductor package in accordance with some embodiments of the present disclosure.

Referring to FIG. 6, after the semiconductor dies 200 are singulated from the thinned wafer 100' (shown in FIG. 4), a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example.

As shown in FIG. 6, in some embodiments, two of the semiconductor dies 200 including the conductive pads 120, the conductive pillars 150, and a protection layer 160a formed thereon are picked and placed on the dielectric layer DI. The semiconductor dies 200 are attached or adhered on the dielectric layer DI through a die attach film (DAF), an adhesion paste or the like. In some alternative embodiments, less or more than two semiconductor dies 200 are picked and placed on the dielectric layer DI, wherein the semiconductor dies 200 placed on the dielectric layer DI may be arranged in an array. In some embodiments, these two semiconductor dies 200 may be the same with each other and have identical function. In some alternative embodiments, these two semiconductor dies 200 may be different from each other and have different functions.

Figure 7:
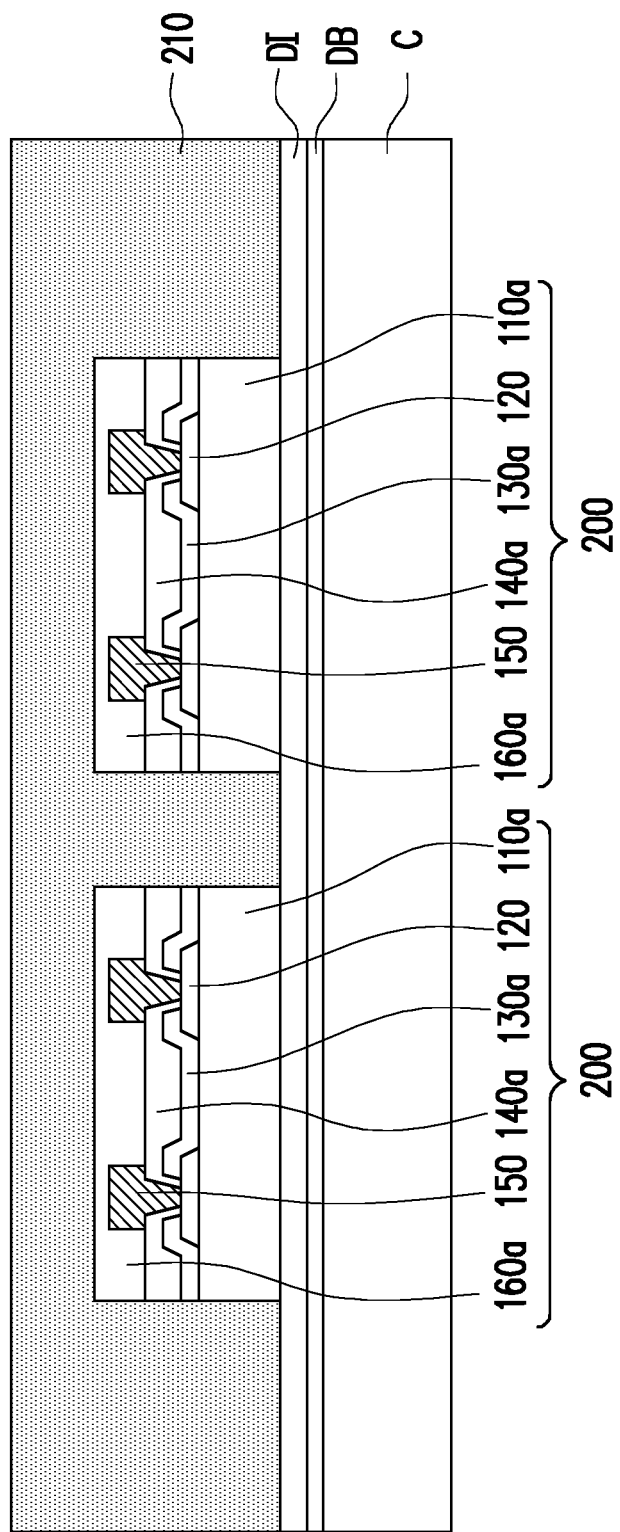

Referring to FIG. 7, an insulating material 210 is formed on the dielectric layer DI to cover the semiconductor dies 200. In some embodiments, the insulating material 210 is a molding compound formed by a molding process. The conductive pillars 150 and the protection layer 160a of the semiconductor dies 200 are covered by the insulating material 210. In other words, the conductive pillars 150 and the protection layer 160a of the semiconductor dies 200 are not revealed and are well protected by the insulating material 210. In some embodiments, the insulating material 210 includes epoxy or other suitable dielectric materials.

Figure 8:
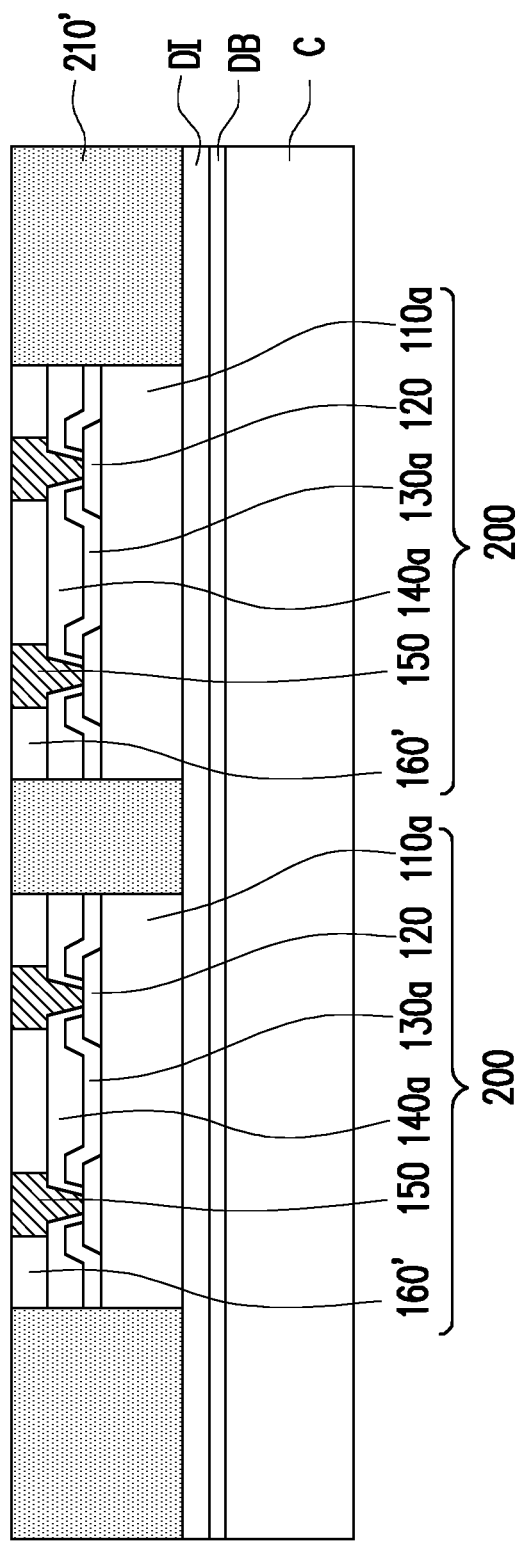

Referring to FIG. 8, the insulating material 210 is then ground until the top surfaces of the conductive pillars or conductive pillars 150, and the top surface of the protection layer 160a are exposed. In some embodiments, the insulating material 210 is ground by a mechanical grinding process and/or a chemical mechanical polishing (CMP) process. After the insulating material 210 is ground, an encapsulant 210' is formed over the dielectric layer DI. During the grinding process of the insulating material 210, portions of the protection layer 160a are ground to form a protection layer 160a'. In some embodiments, during the grinding process of the insulating material 210 and the protection layer 160a, portions of the conductive pillars 150 are ground also.

As shown in FIG. 8, the encapsulant 210' laterally encapsulates the semiconductor dies 200. In other words, the semiconductor dies 200 are embedded in the encapsulant 210'. It is noted that the top surface of the encapsulant 210' and the top surfaces of the conductive pillars 150 are substantially at the same level with the top surface of the protection layer 160a'.

After forming the encapsulant 210' and the protection layer 160a', a redistribution structure RDL1 (shown in FIG. 14) electrically connected to connectors underneath (e.g., the conductive pillars 150 of the semiconductor dies 200) is then formed on the top surface of the encapsulant 210', the top surfaces of the conductive pillars 150, and the top surface of the protection layer 160a'. Here, the afore-said connectors may be the conductive pillars 150 of the semiconductor dies 200. The fabrication of the redistribution structure RDL1 is described in accompany with FIGS. 9 through 22 in detail.

Figure 9:
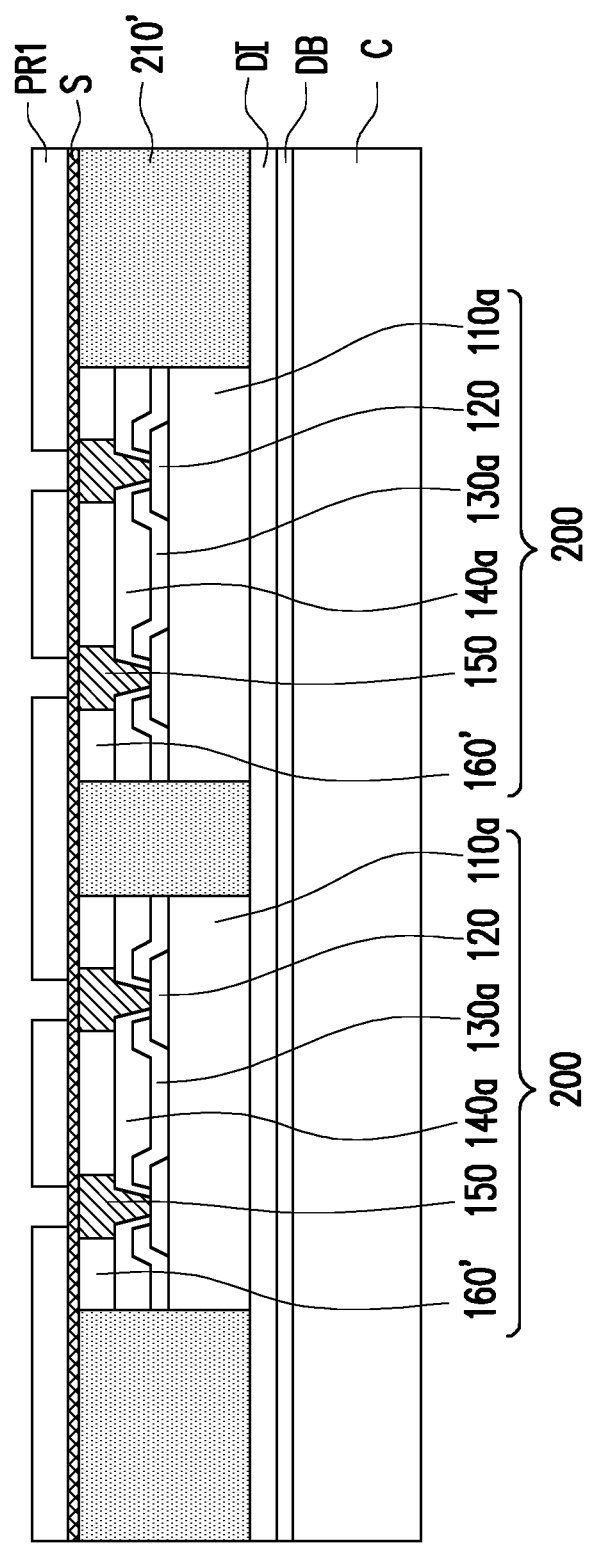

Referring to FIG. 9, a bottom seed layer S is formed on the top surface of the encapsulant 210', the top surfaces of the conductive pillars 150, and the top surface of the protection layer 160a'. In some embodiments, the bottom seed layer S may be a single layer, such as a titanium layer.

In some embodiments, the bottom seed layer S may be a composite layer including a plurality of sub-layers formed of different materials, such as a titanium layer and a copper layer over the titanium layer. The bottom seed layer S may be formed by a physical vapor deposition process (e.g., a sputtering process) or the like. A patterned photoresist layer PR1 is then formed over the bottom seed layer S through a photolithography process. The patterned photoresist layer PR1 includes a plurality of openings for exposing portions of the bottom seed layer S that are corresponding to the conductive pillars 150. In other words, the plurality of openings formed in the patterned photoresist layer PR1 are located above the conductive pillars 150.

Figure 10:
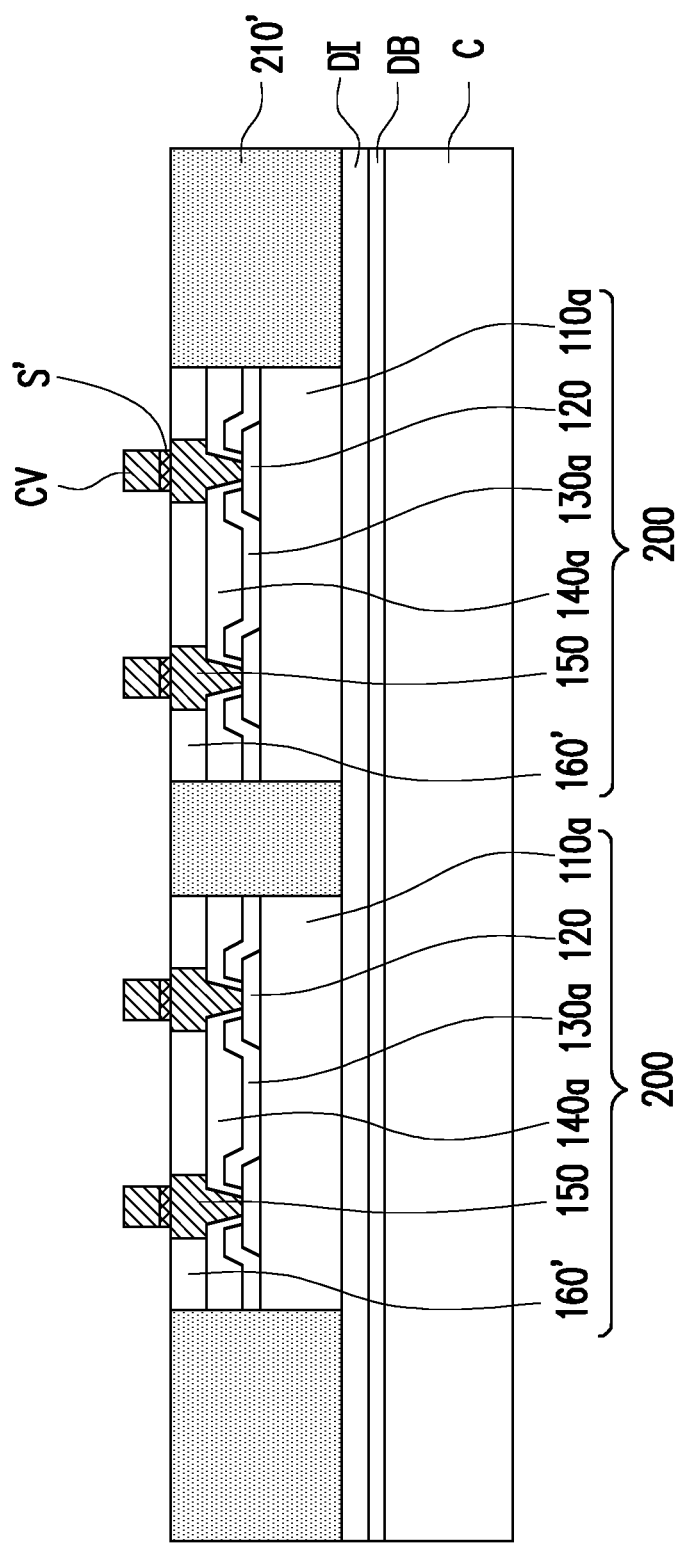

Referring to FIG. 9 and FIG. 10, a plating process is performed on the bottom seed layer S exposed by the openings of the patterned photoresist layer PR1 such that a plurality of conductive vias CV are formed in the openings defined in the patterned photoresist layer PR1. In some embodiments, the conductive vias CV may be copper vias and the thickness of the conductive vias CV may be about 10 micrometers. Since the patterned photoresist layer PR1 is formed through a photolithography process, the dimension of the openings defined in the patterned photoresist layer PR1 may be reduced to about 2 micrometers. Accordingly, the dimension (e.g., width) of the conductive vias CV formed in the openings of the patterned photoresist layer PR1 may be reduced to about 2 micrometers.

After the conductive vias CV are formed, the patterned photoresist layer PR1 is removed. Thereafter, by using the conductive vias CV as a hard mask, portions of the bottom seed layer S that are not covered by the conductive vias CV are removed such that bottom patterned seed layer S' covered by the conductive vias CV is formed on the conductive pillars 150. In some embodiments, the bottom seed layer S may be patterned through an etch process so as to form the bottom patterned seed layer S'.

Figure 11:
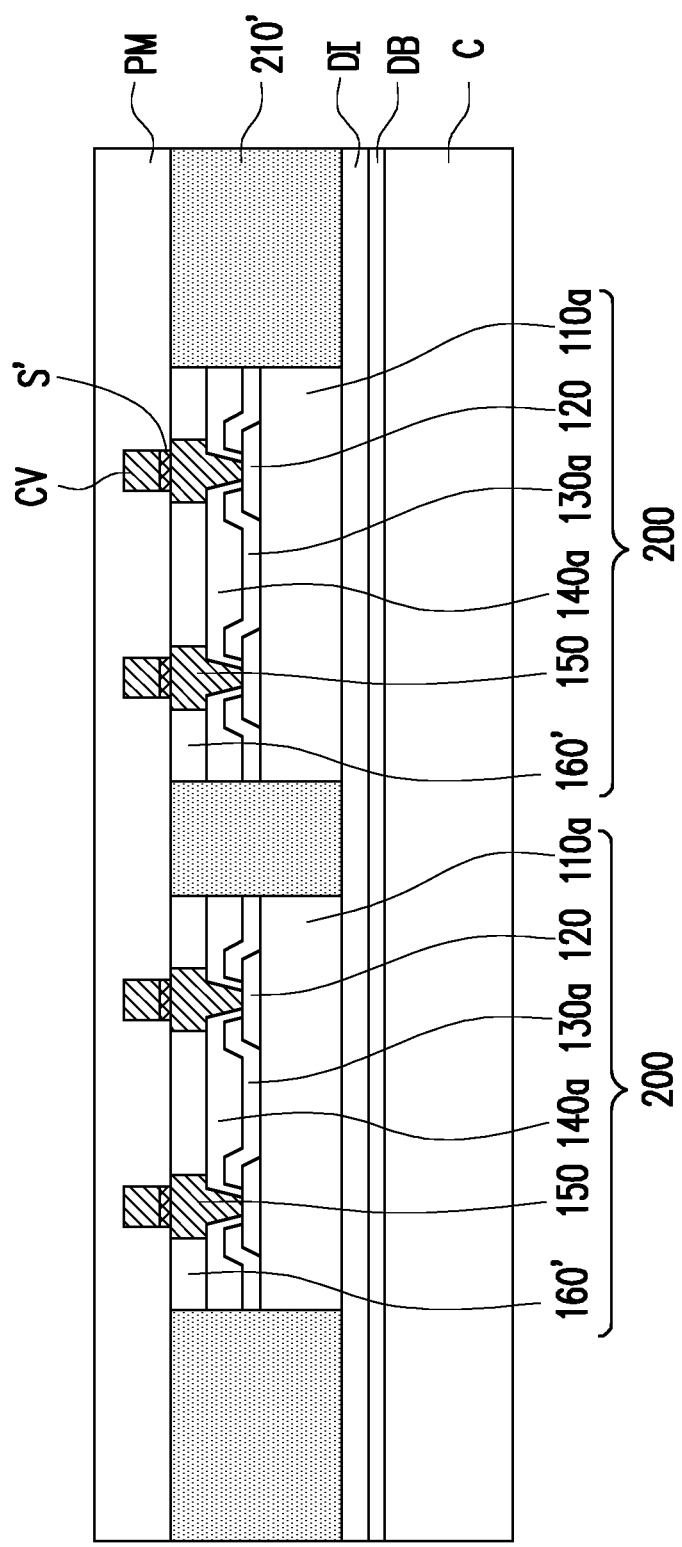
Figure 12:
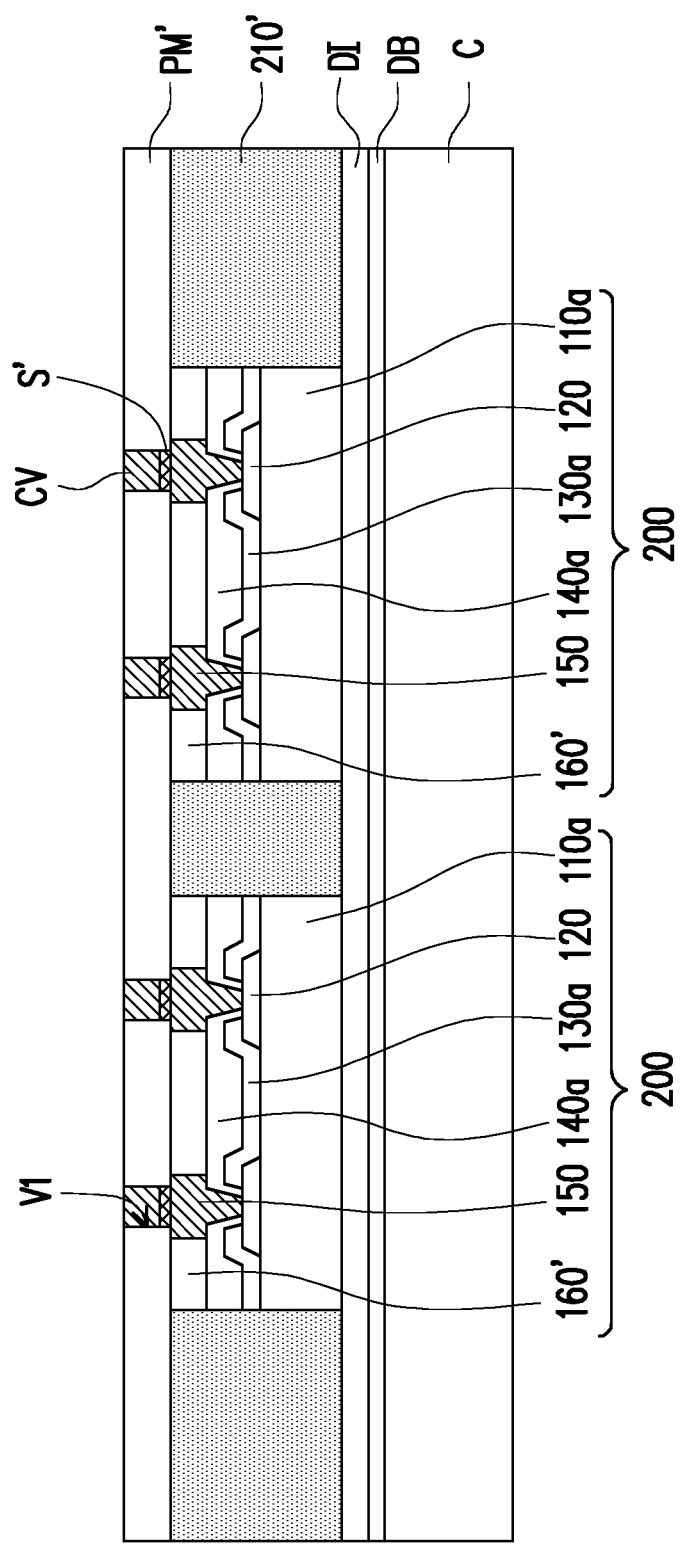

Referring to FIG. 11 and FIG. 12, a dielectric layer PM (e.g., non-photosensitive dielectric material, photosensitive dielectric material or the like) is formed to cover the conductive vias CV and the bottom patterned seed layer S'. A polishing process is performed to partially remove the dielectric layer PM until the conductive vias CV are revealed. After performing the polishing process of the dielectric layer PM, a polished dielectric layer PM' with a reduced thickness is formed and top surfaces of the conductive vias CV are exposed. The polished dielectric layer PM' includes a plurality of via openings V1 and each of the conductive vias CV is located in one of the via openings V1 respectively.

Figure 13:
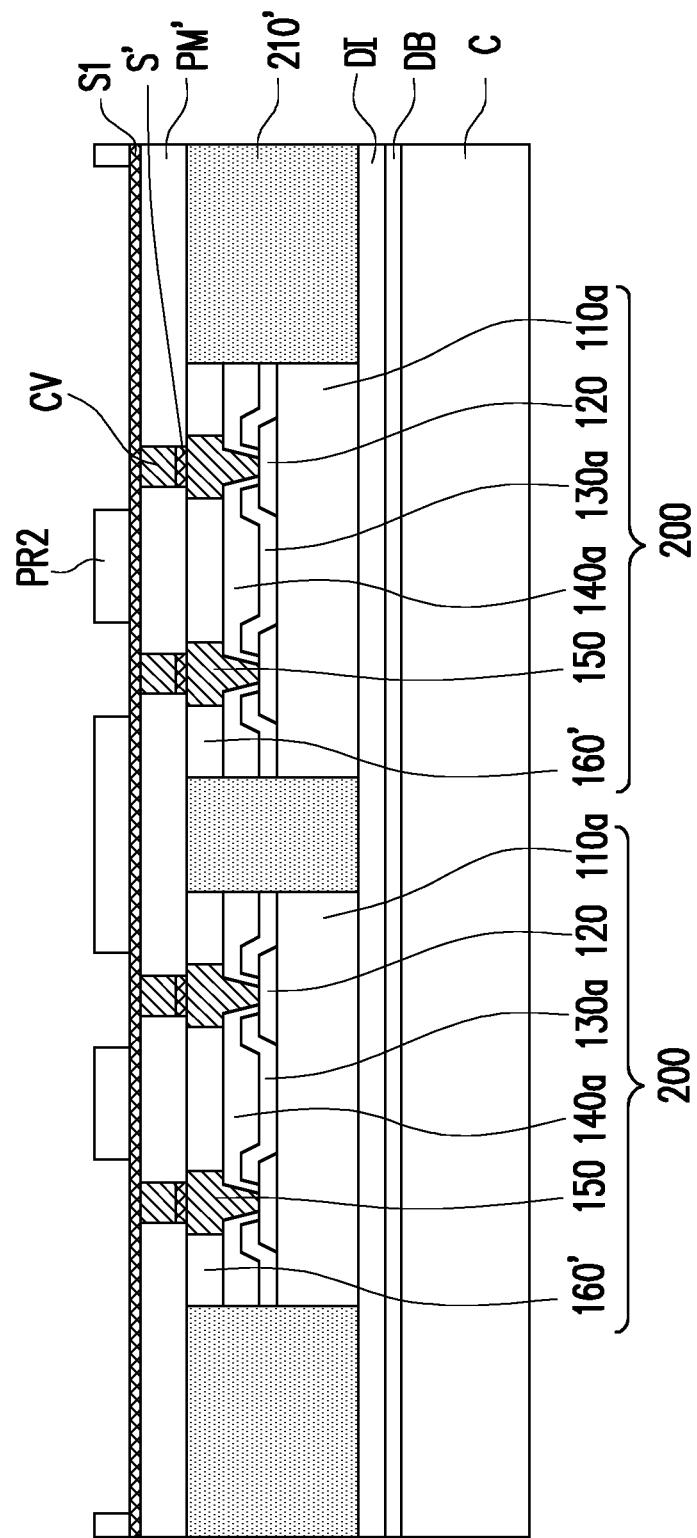

Referring to FIG. 13, a seed layer S1 is conformally formed on the top surfaces of the conductive vias CV and the polished dielectric layer PM'. In some embodiments, the seed layer S1 may be a single layer, such as a titanium layer. In some embodiments, the seed layer S1 may be a composite layer comprising a plurality of sub-layers formed of different materials, such as a titanium layer and a copper layer over the titanium layer. The seed layer S1 may be formed by a physical vapor deposition process (e.g., a sputtering process) or the like. A patterned photoresist layer PR2 is then formed over the seed layer S1 through a photolithography process. The patterned photoresist layer PR2 includes a plurality of openings for exposing portions of the seed layer S1 that are corresponding to the conductive vias CV and portions of the polished dielectric layer PM'.

Figure 14:
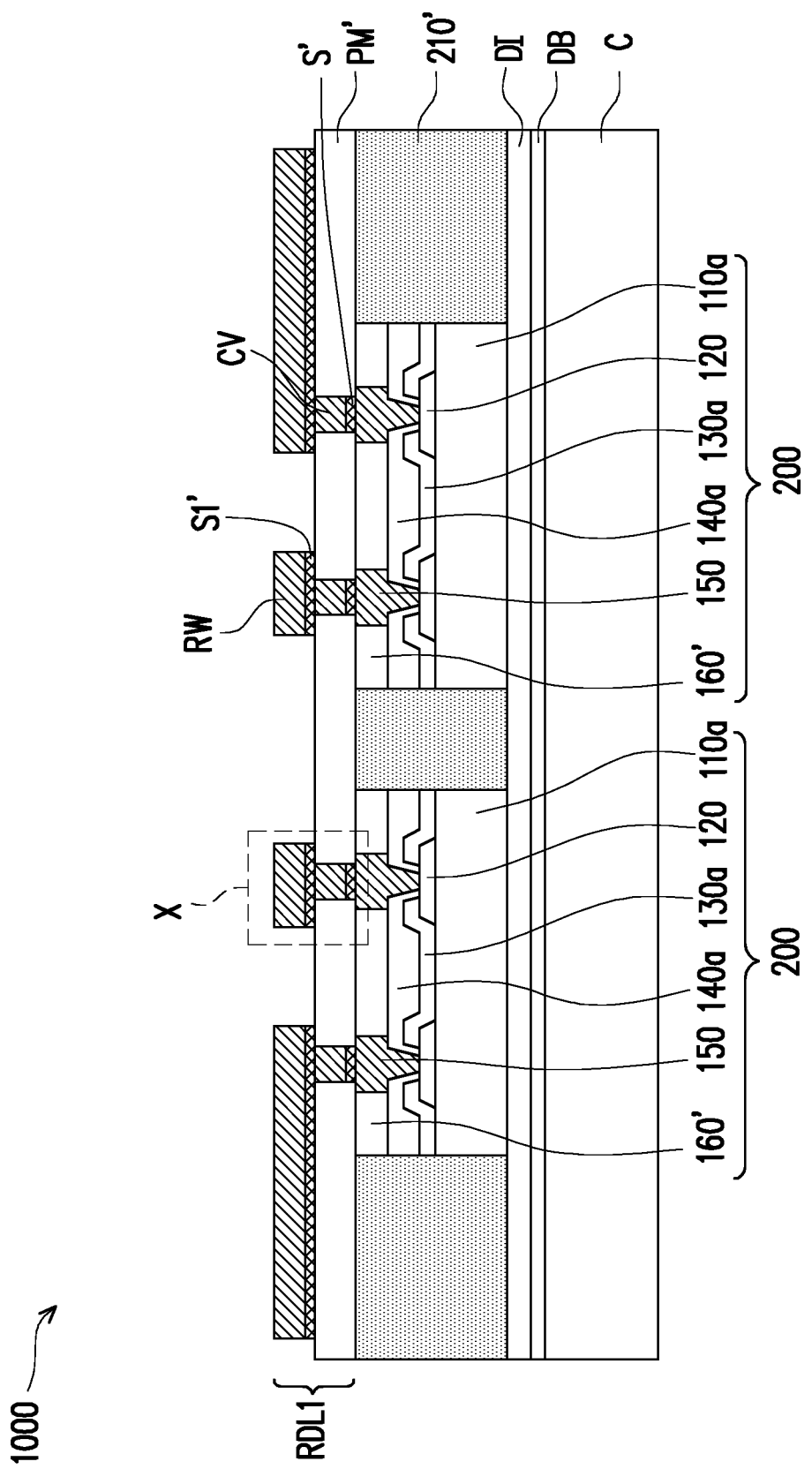

Referring to FIG. 13 and FIG. 14, a plating process is performed on the seed layer S1 exposed by the openings of the patterned photoresist layer PR2 such that a plurality of redistribution wirings RW are formed in the openings defined in the patterned photoresist layer PR2, wherein the redistribution wirings RW are disposed on and in contact with the conductive vias CV and the portions of the polished dielectric layer PM'. In some embodiments, the redistribution wirings RW may be copper wirings. After the redistribution wirings RW are formed, the patterned photoresist layer PR2 is removed. Thereafter, by using the redistribution wirings RW as a hard mask, portions of the seed layer S1 that are not covered by the redistribution wirings RW are removed such that a patterned seed layer S1' covered by the redistribution wirings RW is formed on the conductive vias CV and the portions of the polished dielectric layer PM'.

As shown in FIG. 14, the redistribution structure RDL1 including the bottom patterned seed layer S', the conductive vias CV, the patterned seed layer S1' and the redistribution wirings RW are formed.

FIGS. 15 through 22 are enlarged views of the region X illustrated in FIG. 14 in accordance with various embodiments of the present disclosure. It is noted that the bottom patterned seed layer S' and the patterned seed layer S1' illustrated in FIGS. 15 through 22 are composite layers including two sub-layers formed of different materials, for example. However, the invention is not limited thereto.

Referring to FIGS. 15 through 22, in some embodiments, the dielectric layer PM and the conductive via CV are polished until protruding portions PT of the conductive via CV are formed. As shown in FIGS. 15 through 22, the conductive via CV includes a pillar portion PL embedded in the polished dielectric layer PM' and the protruding portion PT protruding from the pillar portion PL, wherein the protruding portion PT has a tapered sidewall TSW.

In some embodiments, the dielectric layer PM and the conductive via CV are polished through a chemical mechanical polishing (CMP) process and the polishing slurry utilized in the chemical mechanical polishing (CMP) process may determine the contour of the protruding portion PT of the conductive via CV.

As illustrated in FIGS. 15 through 18, when the dielectric layer PM and the conductive via CV are polished through polishing slurry with pH value ranging from about 8 to about 12, the protruding portion PT of the conductive via CV is a pillar-shaped protrusion due to the polishing selectivity. In some embodiments, the polishing slurry may include solvent, filler and chemical additive. The solvent may be water or the like. The filler may be silicon dioxide ($SiO_2$), aluminum oxide ($Al_2O_3$), or the combination thereof. The chemical additive may be potassium hydroxide (KOH), hydrogen peroxide ($H_2O_2$), ammonium hydroxide ($NH_4OH$), tetramethylammonium hydroxide (TMAH), or the combination thereof.

Figure 16:
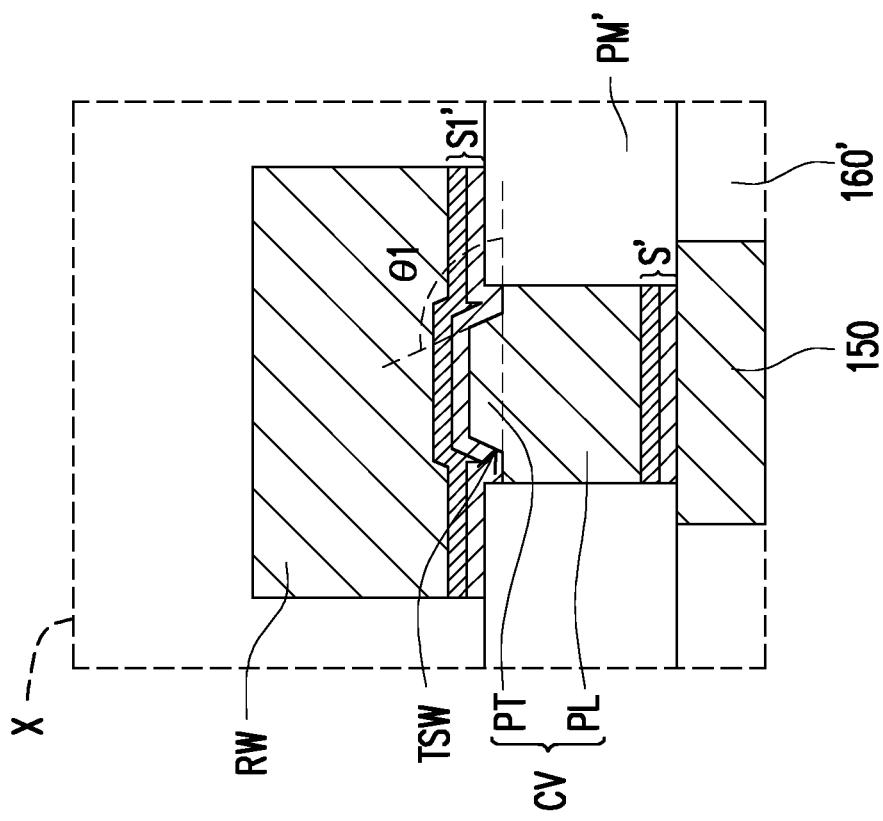
FIGS. 15 through 22 are enlarged views of the region X illustrated in FIG. 14 in accordance with various embodiments of the present disclosure.
Figure 15:
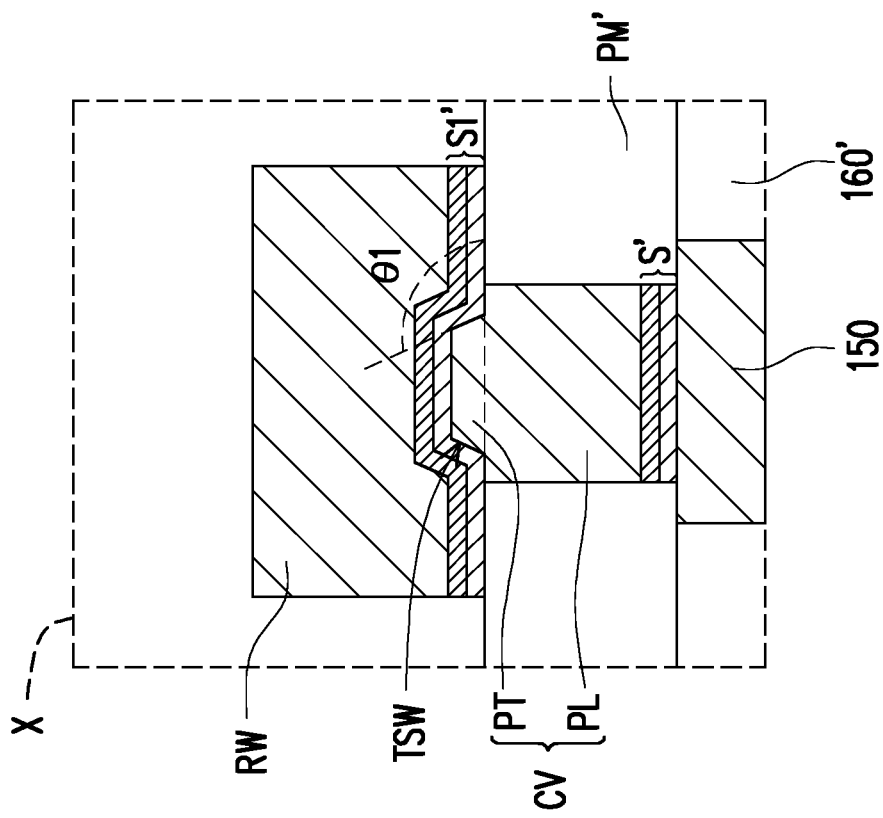

In some embodiments, as shown in FIGS. 15 and 16, the pillar-shaped protrusion may partially cover the top surface of the pillar portion PL. In some alternative embodiments, as shown in FIGS. 17 and 18, the pillar-shaped protrusion may entirely cover the top surface of the pillar portion PL.

Figure 17:
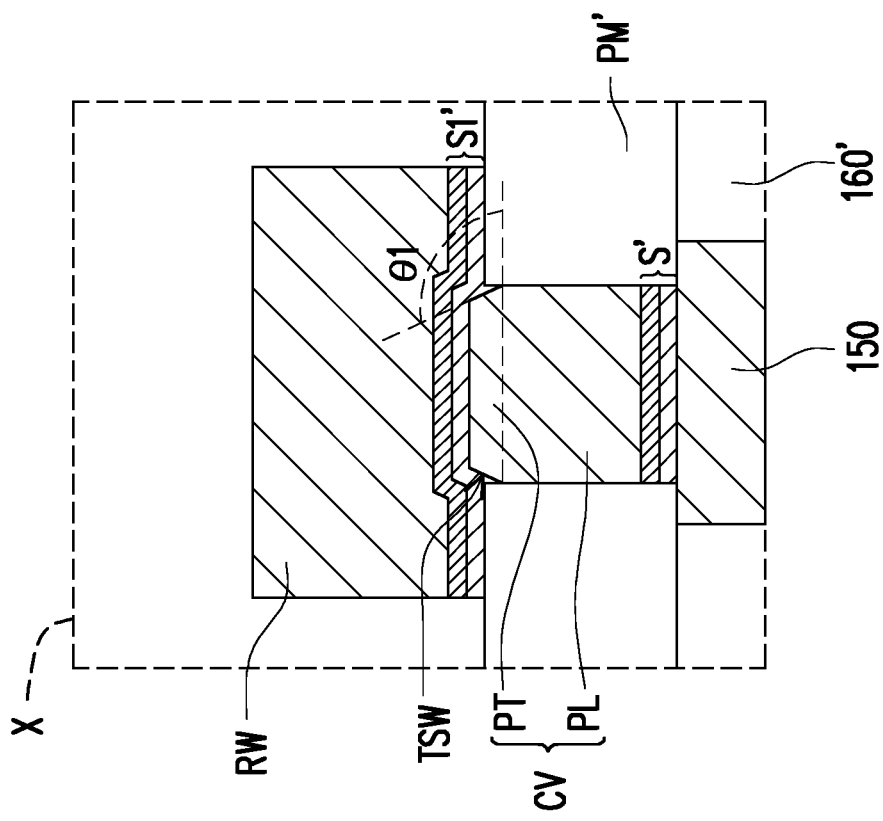
Figure 18:
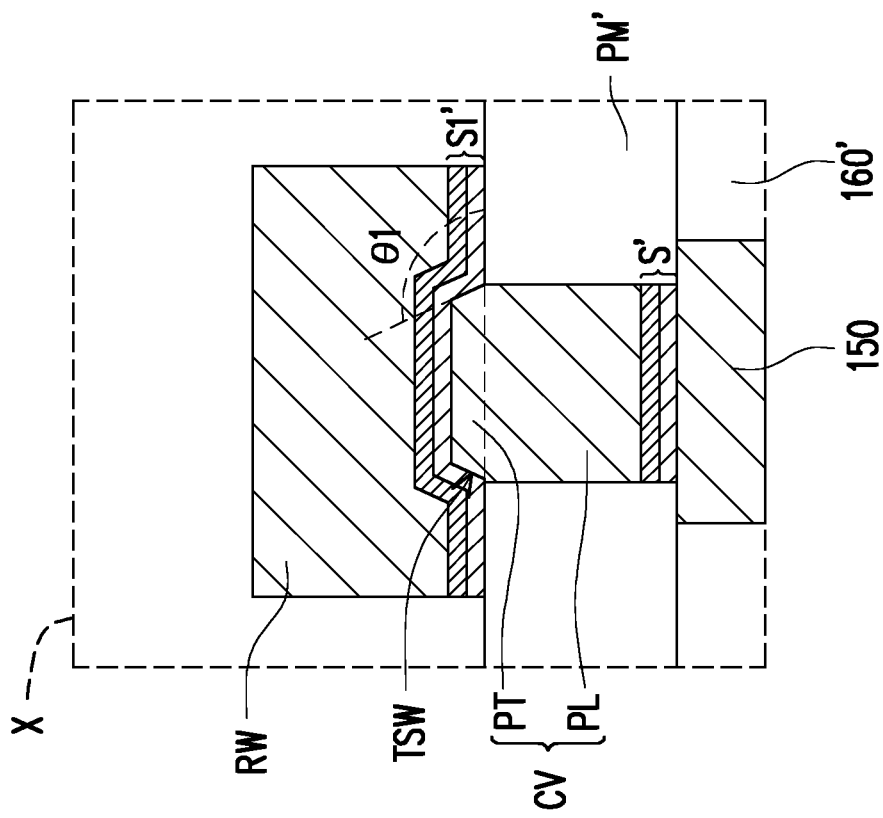

In some embodiments, as shown in FIGS. 15 and 17, the top surface of the pillar portion PL may be substantially level with the top surface of the polished dielectric layer PM'. The patterned seed layer S1' does not extend into the through hole defined in the polished dielectric layer PM'. Furthermore, the patterned seed layer S1' may cover a portion of the top surface of the polished dielectric layer PM', a portion of the top surface of the pillar portion PL, the tapered sidewall TSW of the protruding portion PT and the top surface of the protruding portion PT. In some alternative embodiments, as shown in FIGS. 16 and 18, the top surface of the pillar portion PL may be substantially lower than the top surface of the polished dielectric layer PM'. The patterned seed layer S1' may extend into the through hole defined in the polished dielectric layer PM'. Furthermore, the patterned seed layer S1' may not only cover a portion of the top surface of the polished dielectric layer PM', a portion of the top surface of the pillar portion PL, the tapered sidewall TSW of the protruding portion PT and the top surface of the protruding portion PT, but also cover a sidewall of the polished dielectric layer PM'.

As shown in FIGS. 15 through 18, in some embodiments, the included angle θ1 between the tapered sidewall TSW and the top surface of the pillar portion PL may range from about 90 degrees to about 115 degrees, and the height of the protruding portion PT may range from about 0.1 micrometer to about 0.5 micrometer. In some embodiments, the dimension (e.g., width) of the top surface of the protruding portion PT is about 1.9 micrometers, and the dimension (e.g., width) of the bottom surface of the protruding portion PT is about 1.95 micrometers.

As illustrated in FIGS. 19 through 22, when the dielectric layer PM and the conductive via CV are polished through polishing slurry with pH value ranging from about 1 to about 4, the protruding portion PT of the conductive via CV is a ring-shaped protrusion due to the polishing selectivity. The ring-shaped protrusion is embedded in the polished dielectric layer PM', and the ring-shaped protrusion protrudes from the top surface of the pillar portion PL and extends upwardly along a sidewall of the polished dielectric layer PM'. In some embodiments, the polishing slurry may include solvent, filler or chemical additive. The solvent may be water. The filler may be silicon dioxide ($SiO_2$), aluminum oxide ($Al_2O_3$), or the combination thereof. The chemical additive may be ferric nitrate ($Fe(NO_3)_3$), potassium iodate ($KIO_3$), sulfuric acid ($H_2SO_4$), hydrogen fluoride (HF), or the combination thereof.

Figure 19:
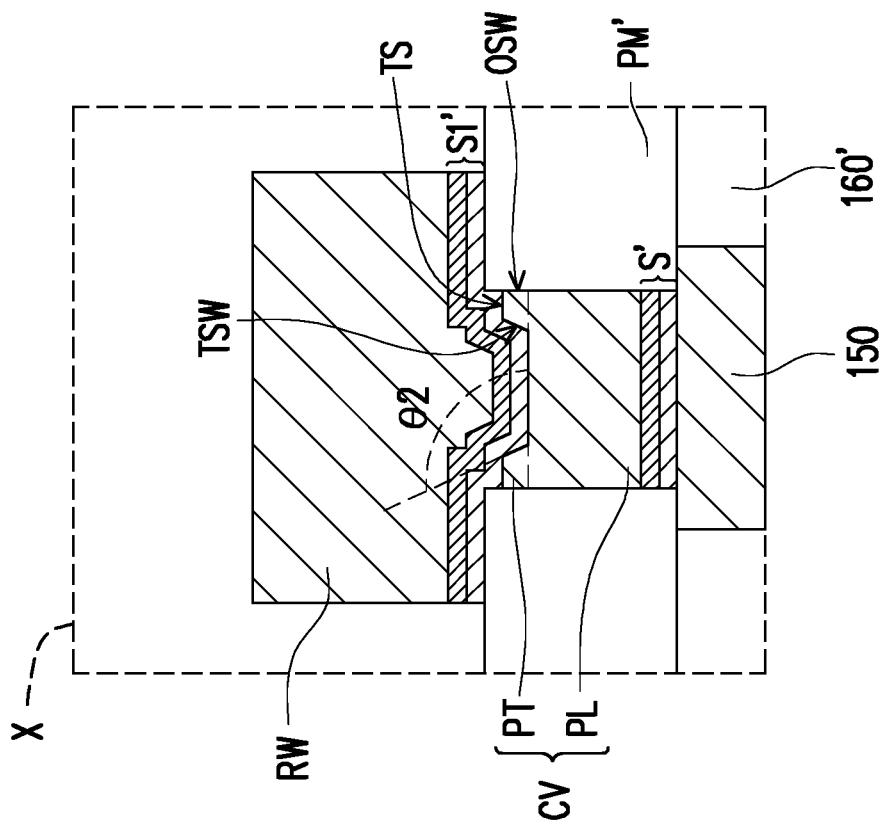
Figure 20:
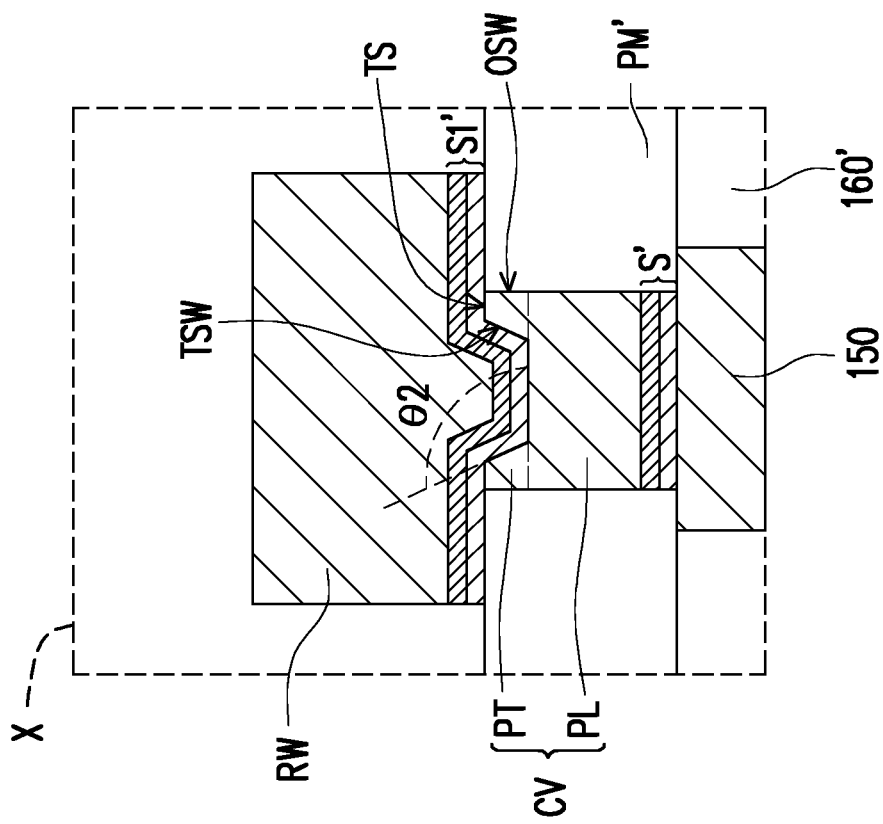
Figure 21:
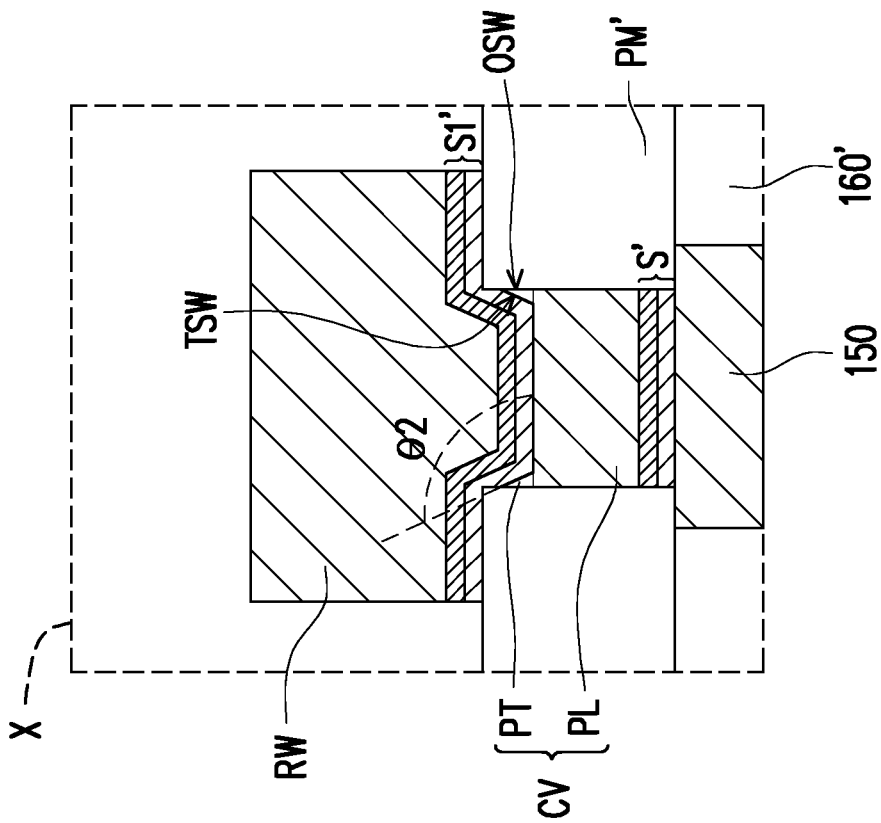
Figure 22:
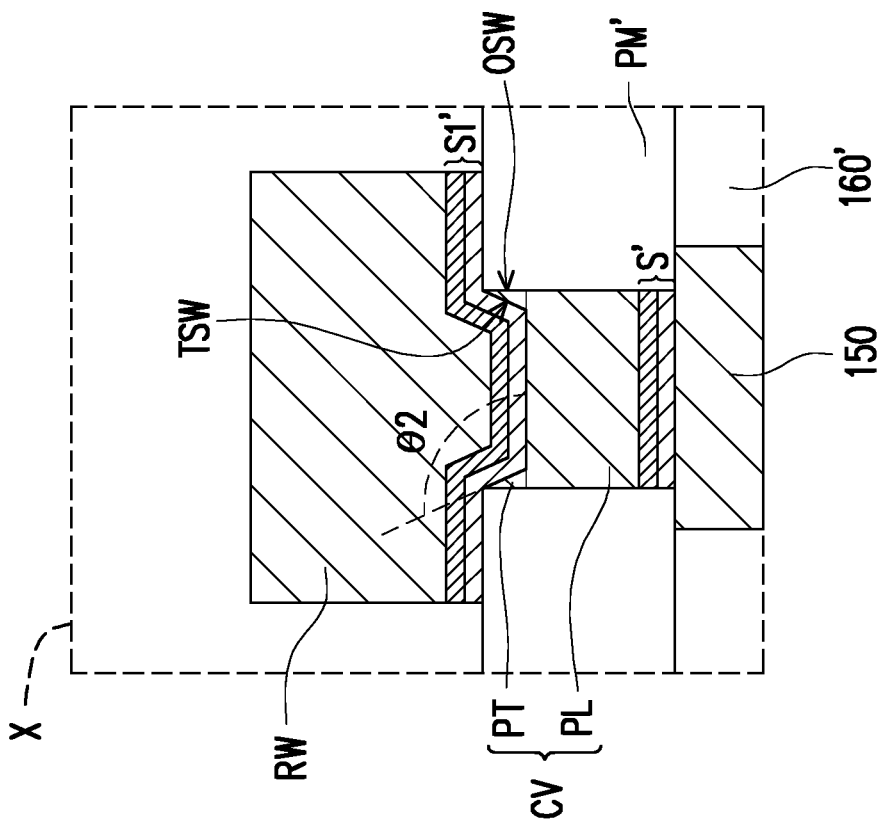

In some embodiments, as shown in FIGS. 19 and 20, the protruding portion PT may further include an outer sidewall OSW and a top surface TS. The outer sidewall OSW is in contact with the polished dielectric layer PM', and the top surface TS is connected between the outer sidewall OSW and the tapered sidewall TSW. In FIG. 19, the patterned seed layer S1' may cover a portion of the top surface of the polished dielectric layer PM', the top surface TS of the protruding portion PT, the tapered sidewall TSW of the protruding portion PT and a portion of the top surface of the pillar portion PL. In FIG. 20, the patterned seed layer S1' may not only cover a portion of the top surface of the polished dielectric layer PM', the top surface TS of the protruding portion PT, the tapered sidewall TSW of the protruding portion PT and a portion of the top surface of the pillar portion PL, but also cover a sidewall of the polished dielectric layer PM'. In some alternative embodiments, as shown in FIGS. 21 and 22, the protruding portion PT may further include an outer sidewall OSW, and the outer sidewall OSW is connected to the tapered sidewall TSW. In FIG. 21, the patterned seed layer S1' may cover a portion of the top surface of the polished dielectric layer PM', the tapered sidewall TSW of the protruding portion PT and a portion of the top surface of the pillar portion PL. In FIG. 22, the patterned seed layer S1' may not only cover a portion of the top surface of the polished dielectric layer PM', the tapered sidewall TSW of the protruding portion PT and a portion of the top surface of the pillar portion PL, but also cover a sidewall of the polished dielectric layer PM'.

In some embodiments, as shown in FIGS. 19 and 21, the topmost end of the protruding portion PT is substantially level with the top surface of the polished dielectric layer PM'. In some alternative embodiments, as shown in FIGS. 20 and 22, the topmost end of the protruding portion PT is lower than the top surface of the polished dielectric layer PM'.

As shown in FIGS. 19 through 22, in some embodiments, the included angle θ2 between the tapered sidewall TSW and the top surface of the pillar portion PL may range from about 90 degrees to about 115 degrees, and the height of the protruding portion PT may range from about 0.1 micrometer to about 0.5 micrometer. In some embodiments, the dimension of the top surface TS of the protruding portion PT is about 0.05 micrometer, and the dimension of the bottom surface of the protruding portion PT is about 0.1 micrometer.

In the above-mentioned embodiments, since the conductive via CV has the protruding portion PT (e.g., the pillar-shaped protrusion and the ring-shaped protrusion) with the tapered side wide TSW, contact areas between the conductive via CV and the seed layer S1' (or the redistribution wirings RW) can be increased, and step coverage of the seed layer S1' on the conductive via CV and the polished dielectric layer PM' may be improved, thereby enhancing the structural strength of the redistribution structure RDL1.

Figure 23:
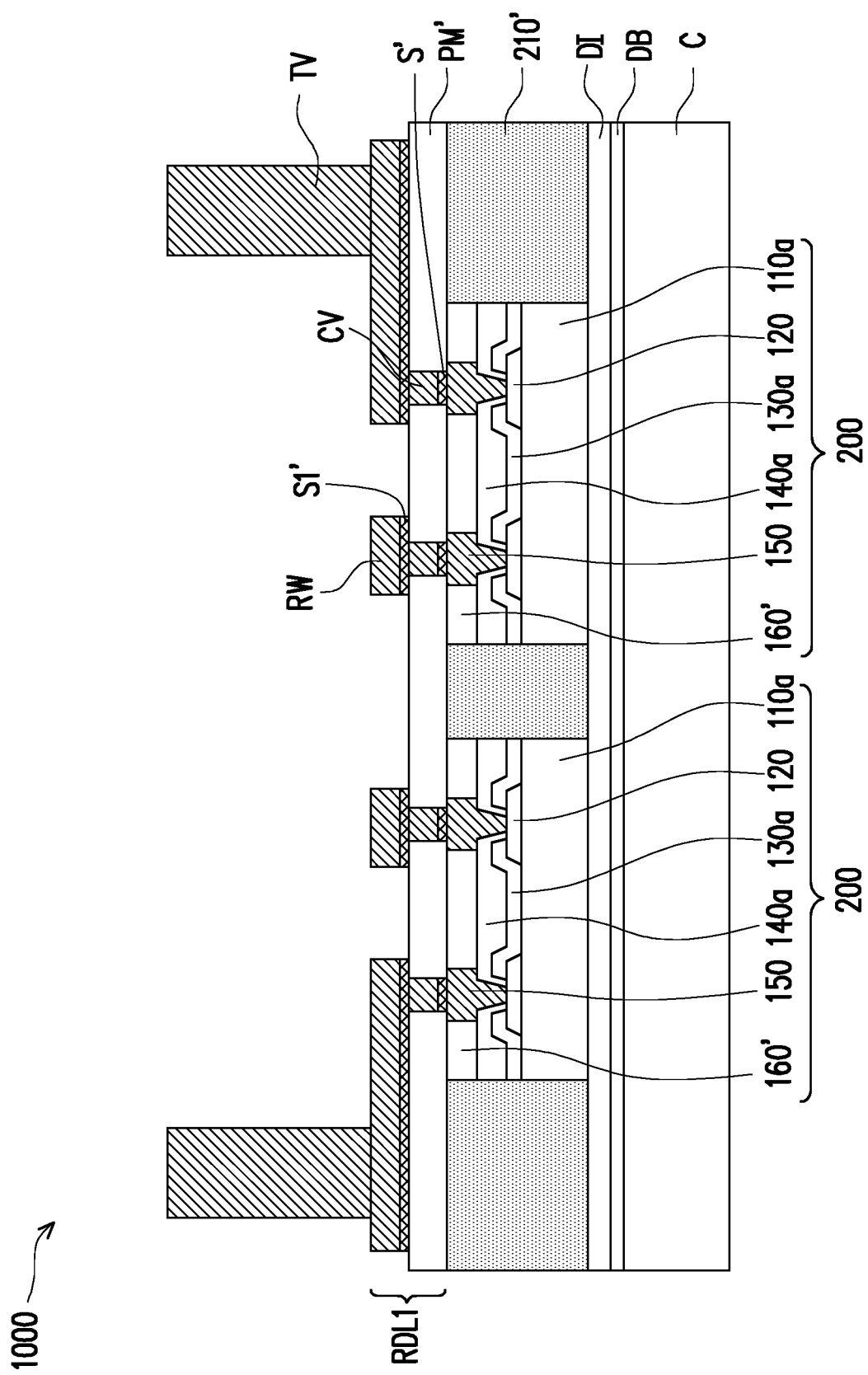

Then, referring to FIG. 23, after the redistribution structure RDL1 is formed, a plurality of conductive through vias TV are formed on the redistribution wirings RW. In some embodiments, the plurality of conductive through vias TV may be formed by photoresist coating, photolithography, plating, and photoresist stripping process. For example, the conductive through vias TV include copper posts or other suitable metal posts.

Figure 24:
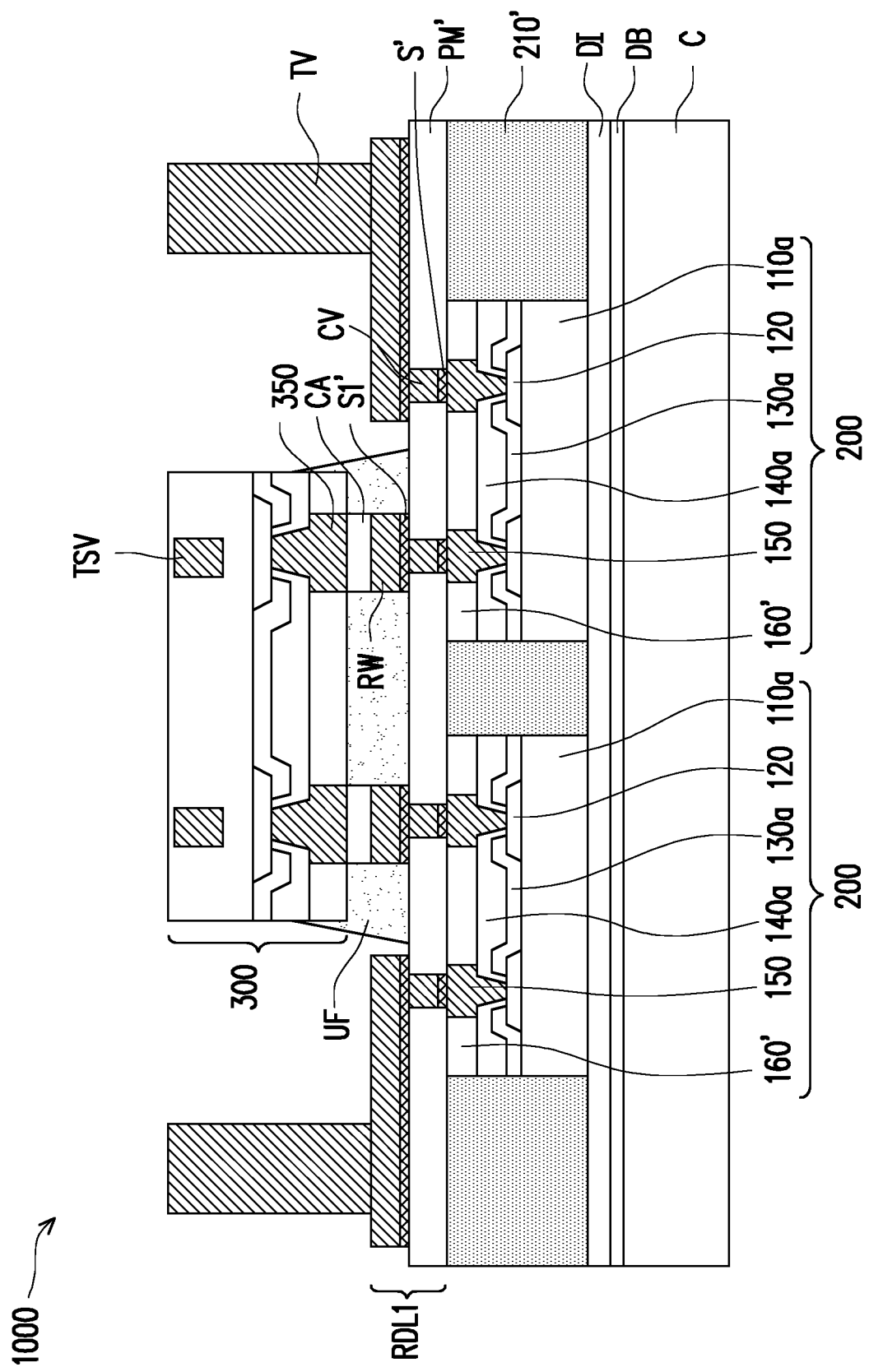

Referring to FIG. 24, a semiconductor component 300 is mounted on the redistribution wirings RW. In some embodiments, the semiconductor component 300 is a semiconductor die, a semiconductor package or other semiconductor device. Take the semiconductor die as an example, the semiconductor component 300 may include a plurality of through semiconductor vias TSV embedded therein. Furthermore, the semiconductor die 300 may include an active surface and a rear surface opposite to the active surface, and the conductive pillars 350 are distributed on the active surface of the semiconductor die 300. Solder caps CA may be formed on the conductive pillars 350 of the semiconductor component 300 so as to facilitate the electrical connection between the redistribution wirings RW and conductive pillars 350 of the semiconductor component 300. An underfill material UF may be formed in the gap between the redistribution structure RDL1 and the semiconductor component 300 to encapsulate the electrical joints (e.g., solder joints) between the redistribution wirings RW and conductive pillars 350 of the semiconductor component 300. For example, the underfill material UF may be formed by a dispensing process.

Figure 25:
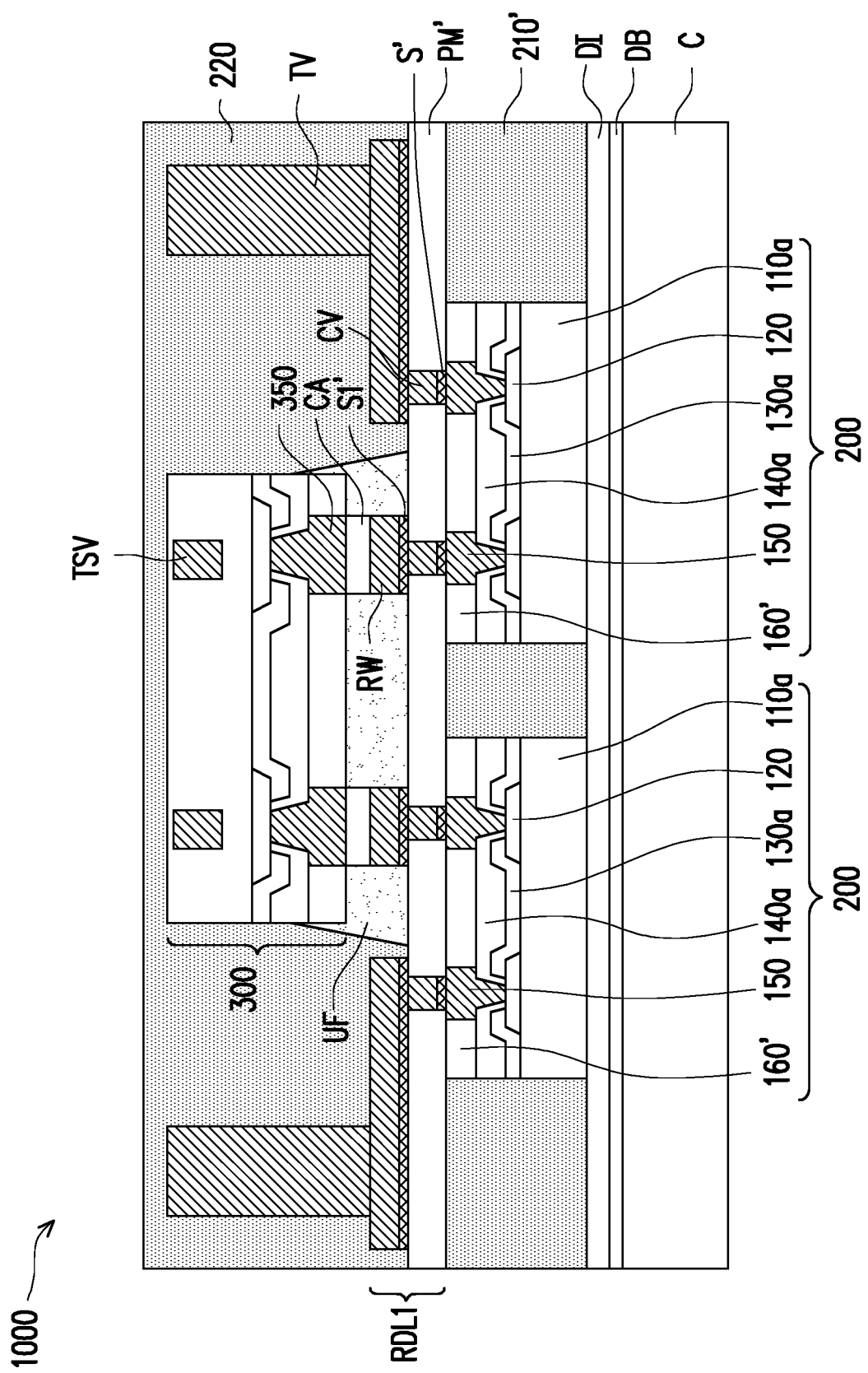

Referring to FIG. 25, an insulating material 220 is formed on the redistribution structure RDL1 to encapsulate conductive through vias TV and the semiconductor component 300. In some embodiments, the insulating material 220 is a molding compound formed by a molding process. In some embodiments, the insulating material 220 includes epoxy or other suitable insulating materials.

Figure 26:
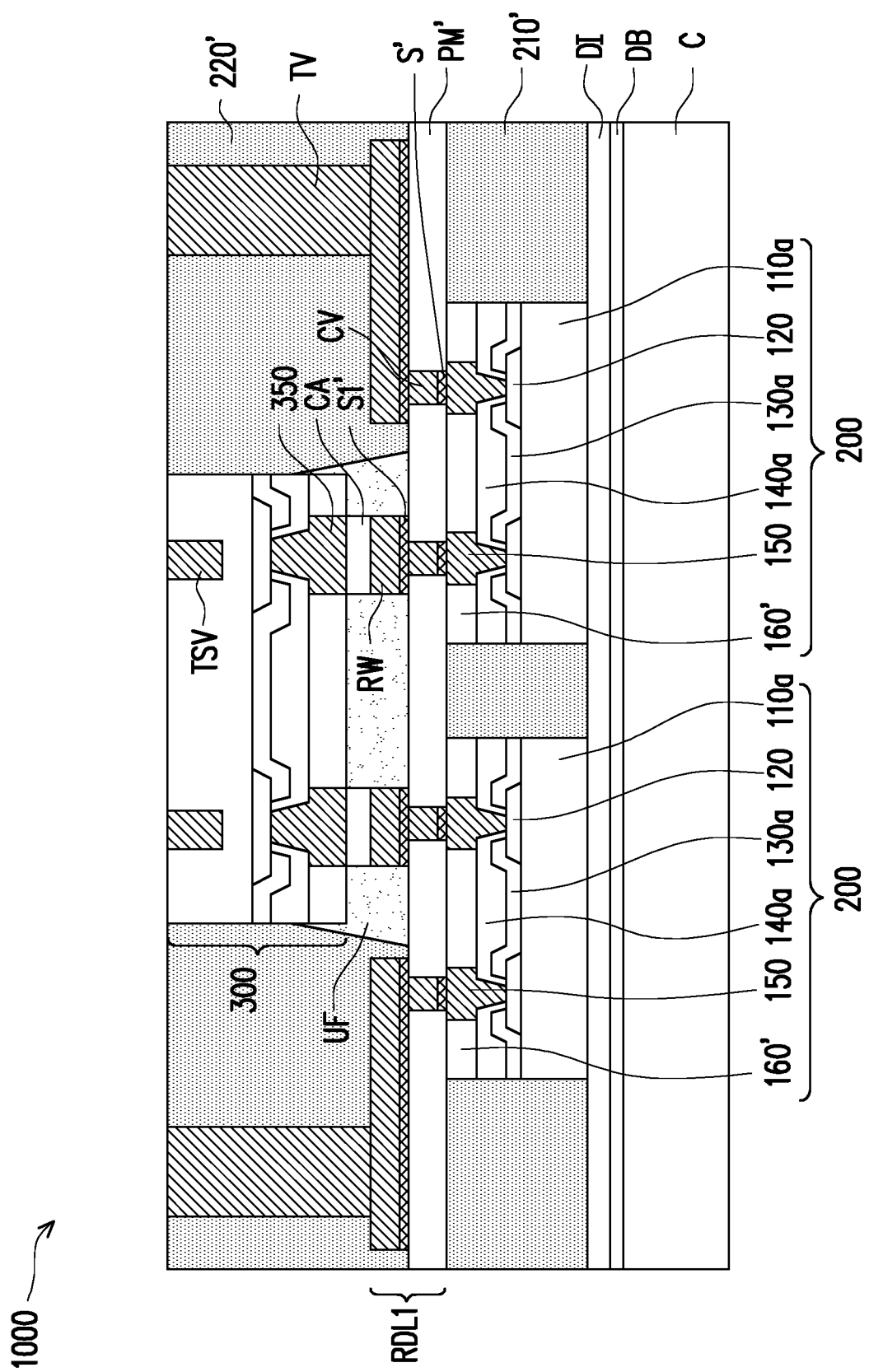

Referring to FIG. 26, the insulating material 220 is then ground until the top surfaces of conductive through vias TV and the through semiconductor vias TSV of the semiconductor component 300 are exposed. In some embodiments, during the grinding process of the insulating material 220, the semiconductor component 300 may be also ground until the through semiconductor vias TSV of the semiconductor component 300 are exposed. In some embodiments, the insulating material 220 and the semiconductor component 300 may be ground by a mechanical grinding process and/or a chemical mechanical polishing (CMP) process. After the insulating material 220 is ground, an encapsulant 220' is formed over the redistribution structure RDL1. In some embodiments, during the grinding process of the insulating material 220, portions of the conductive through vias TV are slightly ground also.

As shown in FIG. 26, the encapsulant 220' laterally encapsulates the semiconductor component 300 and the conductive through vias TV. In other words, the semiconductor component 300 and the conductive through vias TV are embedded in the encapsulant 220'. It is noted that the top surface of the encapsulant 220', the rear surface of the semiconductor component 300, and the top surfaces of the conductive through vias TV are substantially at the same level.

After forming the encapsulant 220', a redistribution structure RDL2 (shown in FIG. 28) may be formed on the top surface of the encapsulant 220', the rear surface of semiconductor component 300, and the top surfaces of the conductive through vias TV so as to electrically connected to the conductive through vias TV and the through semiconductor vias TSV of the semiconductor component 300.

Figure 27:
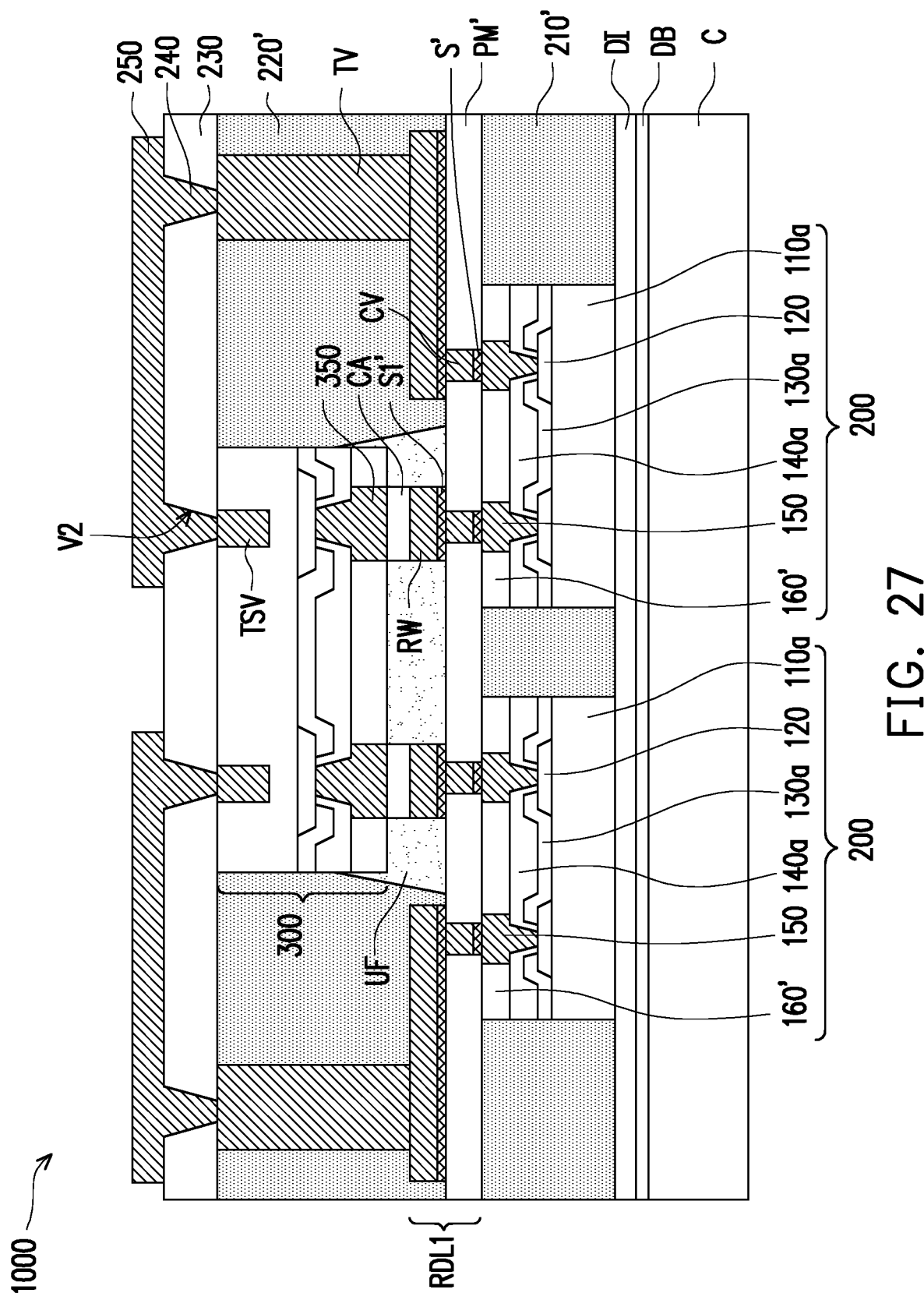

Referring to FIG. 27, a dielectric layer 230 having a plurality of via openings V2 is formed on the top surface of the encapsulant 220', the top surface of semiconductor component 300, and the top surfaces of the conductive through vias TV. The conductive through vias TV and the through semiconductor via TSV of the semiconductor component 300 are exposed by the via openings V2 defined in the dielectric layer 230.

After forming the dielectric layer 230, a seed layer (not shown) is conformally formed on the dielectric layer 230 and portions of the conductive through vias TV and the through semiconductor vias TSV exposed by the via openings V2. Then, a patterned photoresist layer (not shown) is formed on the seed layer. The patterned photoresist layer includes a plurality of openings for exposing portions of the seed layer. Thereafter, conductive vias 240 and the conductive lines 250 are formed in the openings defined in the patterned photoresist layer. The conductive vias 240 and the conductive lines 250 are formed on portions of the seed layer exposed by the openings of the patterned photoresist layer. Then, the patterned photoresist layer is removed. Thereafter, by using conductive vias 240 and the conductive lines 250 as a hard mask, portions of the seed layer that are not covered by the conductive vias 240 and the conductive lines 250 are removed.

Figure 28:
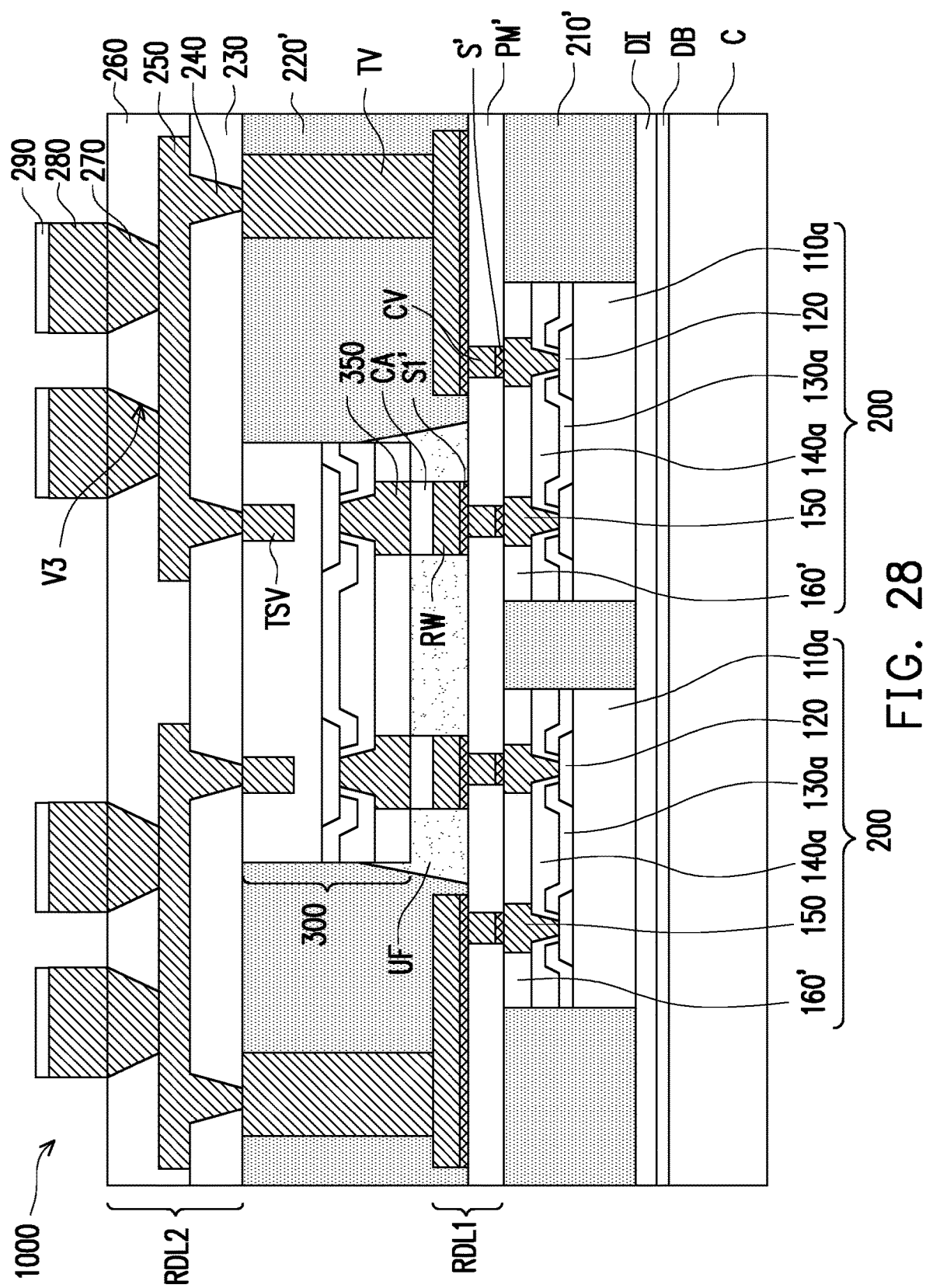

Referring to FIG. 28, after forming the conductive vias 240 and the conductive lines 250, a dielectric layer 260 having a plurality of via openings V3 is formed on the top surface of the conductive lines 250. The conductive lines 250 are exposed by the via openings V3 defined in the dielectric layer 260. In some embodiments, the dielectric layer 260 may be photosensitive dielectric layer and may be patterned through a photolithography process so as to form the third via openings V3. Then, a plurality of conductive vias 270 are formed in the via openings V3.

As shown in FIG. 28, the redistribution structure RDL2 including the dielectric layer 230 and 260, the conductive vias 240 and 270, and the conductive lines 250 are formed. In some embodiments, the redistribution structure RDL2 includes more layers of conductive lines and conductive vias. Then, a plurality of conductive connectors 280 are formed on the top surface of the conductive vias 270, and a solder cap 290 may be formed on the top of the conductive connectors 280. In some embodiments, the conductive connectors 280 may be solder bumps, controlled collapse chip connection (C4) bumps, ball grid array (BGA) balls, micro bumps, or the like.

Figure 29:
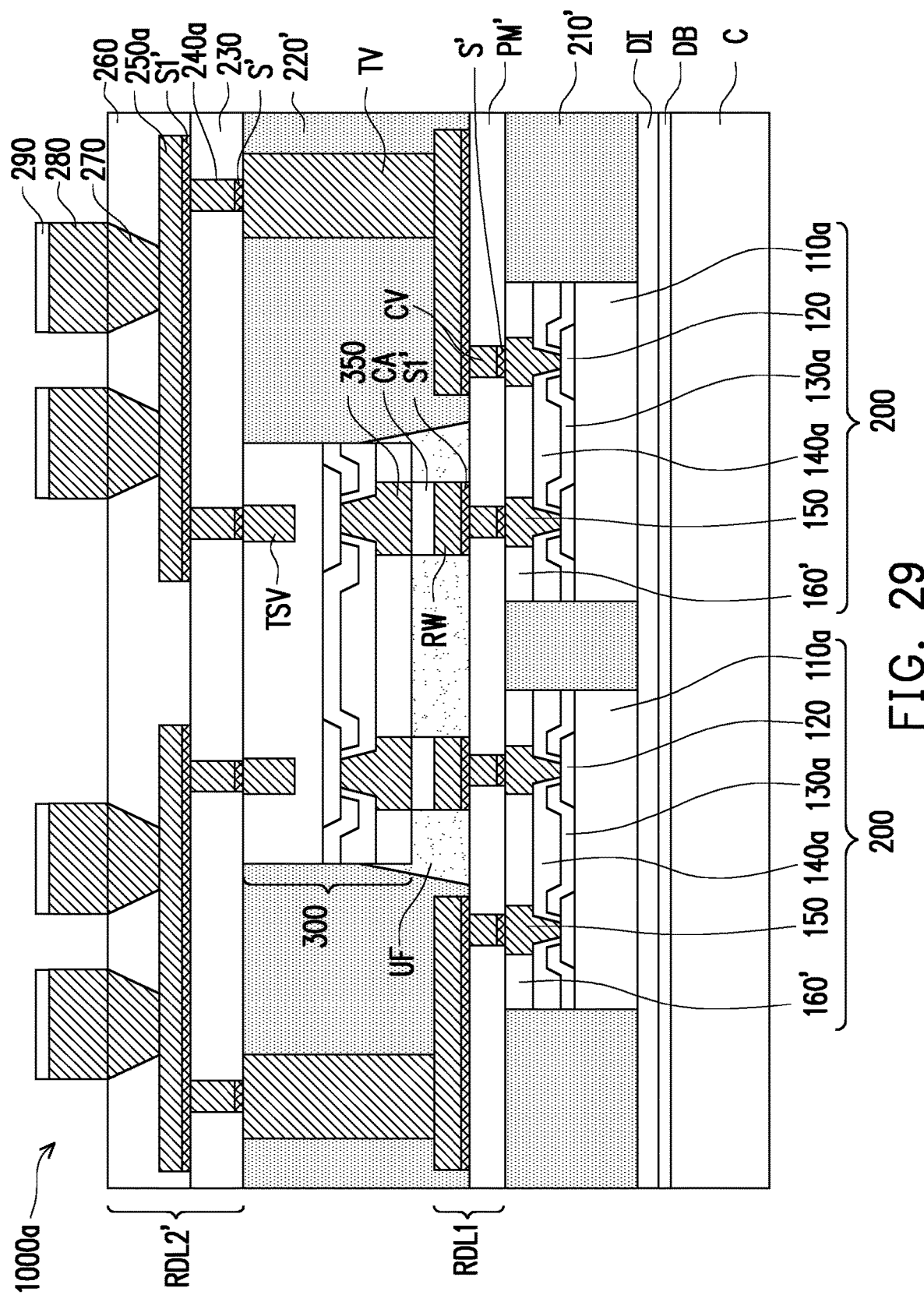
FIG. 29 illustrates a cross-sectional view of a semiconductor package in accordance with other embodiments of the present disclosure.

FIG. 29 illustrates a cross-sectional view of a semiconductor package 1000a that is similar to the semiconductor package 1000 of FIG. 28, except that the forming method of the conductive vias 240a and the conductive lines 250a of the redistribution structure RDL2' is different from that of the conductive vias 240 and the conductive lines 250 of the redistribution structure RDL2. For example, the conductive vias 240a and the conductive lines 250a may be formed using similar materials and methods as the conductive vias CV and the redistribution wirings RW described above, and the detailed description is thus omitted herein.

Since the redistribution structure RDL2' illustrated in FIG. 29 includes the conductive vias 240a and the conductive lines 250a formed in a similar method with the conductive vias CV and the redistribution wirings RW described above, high density routing with fine pitch as well as reduced layers of conductive lines and conductive vias may be achieved.

In accordance with some embodiments of the disclosure, a semiconductor device including a semiconductor die, an encapsulant and a redistribution structure is provided. The encapsulant laterally encapsulates the semiconductor die. The redistribution structure is disposed on the semiconductor die and the encapsulant and is electrically connected to the semiconductor die. The redistribution structure includes a dielectric layer, a conductive via in the dielectric layer and a redistribution wiring covering the conductive via and a portion of the dielectric layer. The conductive via includes a pillar portion embedded in the dielectric layer and a protruding portion protruding from the pillar portion, wherein the protruding portion has a tapered sidewall.

In accordance with some embodiments of the disclosure, a semiconductor device including a semiconductor die, an encapsulant and a redistribution structure is provided. The encapsulant laterally encapsulates the semiconductor die. The redistribution structure is disposed on the semiconductor die and the encapsulant and is electrically connected to the semiconductor die. The redistribution structure includes a dielectric layer, a conductive via and a redistribution wiring covering the conductive via and a portion of the dielectric layer. The dielectric layer includes a via opening. The conductive via is in the via opening. The conductive via includes a pillar portion embedded in the dielectric layer and a protruding portion protruding from the pillar portion, wherein the protruding portion has a tapered sidewall.

In accordance with some embodiments of the disclosure, a method of fabricating a semiconductor device includes the following steps. a semiconductor die is laterally encapsulated with an encapsulant; a conductive via is formed on the semiconductor die; a dielectric layer is formed on the semiconductor die and the encapsulant to cover the conductive via; the dielectric layer and the conductive via is polished until a protruding portion of the conductive via is formed, wherein the protruding portion has a tapered sidewall; and a redistribution wiring is formed on the conductive via and a portion of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor die;
an encapsulant laterally encapsulating the semiconductor die; and
a redistribution structure disposed on the semiconductor die and the encapsulant and electrically connected to the semiconductor die, and the redistribution structure comprising:
a dielectric layer;
a conductive via in the dielectric layer, the conductive via comprising a pillar portion embedded in the dielectric layer and a protruding portion protruding from the pillar portion, wherein the protruding portion has a tapered sidewall; and
a redistribution wiring covering the conductive via and a portion of the dielectric layer.

2. The semiconductor device as claimed in claim 1, wherein the protruding portion is a ring-shaped protrusion embedded in the dielectric layer, and the ring-shaped protrusion protrudes from a top surface of the pillar portion and extends upwardly along a sidewall of the dielectric layer.

3. The semiconductor device as claimed in claim 2, wherein the protruding portion further comprises an outer sidewall in contact with the dielectric layer.

4. The semiconductor device as claimed in claim 3, wherein the outer sidewall is connected to the tapered sidewall.

5. The semiconductor device as claimed in claim 3, wherein the protruding portion further comprises a top surface connected between the outer sidewall and the tapered sidewall.

6. The semiconductor device as claimed in claim 1, wherein a topmost end of the protruding portion is substantially level with or lower than a top surface of the dielectric layer.

7. The semiconductor device as claimed in claim 1, wherein the protruding portion is a pillar-shaped protrusion.

8. The semiconductor device as claimed in claim 7, wherein the pillar-shaped protrusion partially covers a top surface of the pillar portion.

9. The semiconductor device as claimed in claim 7, wherein the pillar-shaped protrusion entirely covers a top surface of the pillar portion.

10. The semiconductor device as claimed in claim 7, wherein a top surface of the pillar portion is substantially level with or lower than a top surface of the dielectric layer.

11. The semiconductor device as claimed in claim 1 further comprising a semiconductor component disposed on the redistribution structure and electrically connected to the redistribution wiring.

12. A semiconductor device, comprising:
a semiconductor die;
an encapsulant laterally encapsulating the semiconductor die; and
a redistribution structure disposed on the semiconductor die and the encapsulant and electrically connected to the semiconductor die, and the redistribution structure comprising:
a dielectric layer comprising a via opening;
a conductive via in the via opening, the conductive via comprising a pillar portion embedded in the dielectric layer and a protruding portion protruding from the pillar portion, wherein the protruding portion has a tapered sidewall; and
a redistribution wiring covering the conductive via and a portion of the dielectric layer.

13. The semiconductor device as claimed in claim 12, wherein the protruding portion is a ring-shaped protrusion embedded in the via opening, and the ring-shaped protrusion protrudes from a top surface of the pillar portion and extends upwardly along a sidewall of the via opening.

14. The semiconductor device as claimed in claim 13, wherein the protruding portion further comprises an outer sidewall in contact with the sidewall of the via opening.

15. The semiconductor device as claimed in claim 12, wherein the protruding portion is a pillar-shaped protrusion.

16. The semiconductor device as claimed in claim 15, wherein the pillar-shaped protrusion partially covers a top surface of the pillar portion.

* * * * *